US008169686B2

(12) United States Patent  
Kothari et al.

(10) Patent No.: US 8,169,686 B2
(45) Date of Patent: May 1, 2012

(54) DISPLAY WITH INTEGRATED PHOTOVOLTAICS

(75) Inventors: Manish Kothari, Cupertino, CA (US); Kasra Khazeni, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 225 days.

(21) Appl. No.: 12/254,782

(22) Filed: Oct. 20, 2008

(65) Prior Publication Data

US 2009/0103165 A1    Apr. 23, 2009

Related U.S. Application Data

(60) Provisional application No. 60/999,566, filed on Oct. 19, 2007.

(51) Int. Cl.
*G02B 26/00* (2006.01)

(52) U.S. Cl. ........................................................ 359/290

(58) Field of Classification Search ........... 359/290–296
See application file for complete search history.

(56) References Cited

U.S. PATENT DOCUMENTS

| | | | |
|---|---|---|---|
| 2,677,714 A | 5/1954 | Auwarter | |
| 3,247,392 A | 4/1966 | Thelen | |
| 3,679,313 A | 7/1972 | Rosenberg | |
| 4,116,718 A | 9/1978 | Yerkes et al. | |
| 4,200,472 A | 4/1980 | Chappell et al. | |
| 4,282,862 A | 8/1981 | Soleau | |
| 4,357,486 A | 11/1982 | Blieden et al. | |
| 4,377,324 A | 3/1983 | Durand | |
| 4,400,577 A | 8/1983 | Spear | |
| 4,403,248 A | 9/1983 | Te Velde | |
| 4,441,789 A | 4/1984 | Pohlack | |
| 4,459,182 A | 7/1984 | Te Velde | |
| 4,497,974 A | 2/1985 | Deckman et al. | |
| 4,633,031 A | 12/1986 | Todorof | |
| 4,688,068 A | 8/1987 | Chaffin et al. | |
| 4,705,361 A | 11/1987 | Frazier et al. | |
| 4,822,993 A | 4/1989 | Dillon et al. | |
| 4,859,060 A | 8/1989 | Katagiri | |
| 4,982,184 A | 1/1991 | Kirkwood | |
| 5,110,370 A | 5/1992 | Vogeli et al. | |
| 5,261,970 A | 11/1993 | Landis et al. | |
| 5,356,488 A | 10/1994 | Hezel | |
| 5,401,983 A | 3/1995 | Jokerst | |

(Continued)

FOREIGN PATENT DOCUMENTS

DE    10329917    2/2005

(Continued)

OTHER PUBLICATIONS

Specification for Pathfinder™ Watch (Model No. PAW1300-1V) on worldwide web page for Casio.com, printed on Oct. 20, 2008.

(Continued)

*Primary Examiner* — Ricky Mack
*Assistant Examiner* — Vipin Patel
(74) *Attorney, Agent, or Firm* — Knobbe Martens Olson & Bear LLP

(57) ABSTRACT

A display with patterned photovoltaic (PV) material integrated on the front side and/or back side of the display is disclosed. Light may reach PV material situated behind a display through fully or partially transmissive features or gaps within the display. Display-generated light may also reach PV material behind a display. A patterned PV material situated in front of a display may collect both ambient light as well as display-generated light.

28 Claims, 15 Drawing Sheets

U.S. PATENT DOCUMENTS

| | | | |
|---|---|---|---|
| 5,544,268 A | 8/1996 | Bischel et al. | |
| 5,550,373 A | 8/1996 | Cole | |
| 5,578,140 A | 11/1996 | Yogev et al. | |
| 5,720,827 A | 2/1998 | Simmons | |
| 5,726,805 A | 3/1998 | Kaushik et al. | |
| 5,782,995 A | 7/1998 | Nanya et al. | |
| 5,886,688 A | 3/1999 | Fifield et al. | |
| 5,907,426 A * | 5/1999 | Kato et al. | 359/239 |
| 5,986,796 A | 11/1999 | Miles | |
| 6,008,449 A | 12/1999 | Cole | |
| 6,021,007 A | 2/2000 | Murtha | |
| 6,040,937 A | 3/2000 | Miles | |
| 6,055,090 A | 4/2000 | Miles | |
| 6,094,285 A | 7/2000 | Wickham et al. | |
| 6,123,431 A | 9/2000 | Teragaki et al. | |
| 6,300,558 B1 | 10/2001 | Takamoto et al. | |
| 6,323,415 B1 | 11/2001 | Uematsu et al. | |
| 6,323,923 B1 | 11/2001 | Hoshino et al. | |
| 6,518,944 B1 | 2/2003 | Doane et al. | |
| 6,650,455 B2 | 11/2003 | Miles | |
| 6,674,562 B1 | 1/2004 | Miles | |
| 6,741,377 B2 | 5/2004 | Miles | |
| 6,768,555 B2 | 7/2004 | Chen et al. | |
| 6,822,157 B2 | 11/2004 | Fujioka | |
| 6,891,869 B2 | 5/2005 | Augusto | |
| 6,970,155 B2 * | 11/2005 | Cabrera | 345/107 |
| 7,123,216 B1 | 10/2006 | Miles | |
| 7,187,489 B2 | 3/2007 | Miles | |
| 7,327,510 B2 | 2/2008 | Cummings et al. | |
| 7,385,748 B2 | 6/2008 | Miles | |
| 7,463,421 B2 | 12/2008 | Miles | |
| 7,595,926 B2 | 9/2009 | Sasagawa et al. | |
| 7,605,969 B2 | 10/2009 | Miles | |
| 7,701,029 B2 | 4/2010 | Mabuchi | |
| 7,719,500 B2 | 5/2010 | Chui | |
| 7,804,023 B2 | 9/2010 | Wong et al. | |
| 2001/0006066 A1 | 7/2001 | Cherney et al. | |
| 2002/0024711 A1 | 2/2002 | Miles | |
| 2002/0050286 A1 | 5/2002 | Kubota | |
| 2003/0006730 A1 | 1/2003 | Tachibana | |
| 2003/0213514 A1 | 11/2003 | Ortabasi | |
| 2004/0076802 A1 | 4/2004 | Tompkin et al. | |
| 2004/0188599 A1 | 9/2004 | Viktorovitch et al. | |
| 2004/0200520 A1 | 10/2004 | Mulligan et al. | |
| 2004/0259010 A1 | 12/2004 | Kanbe | |
| 2005/0117623 A1 | 6/2005 | Shchukin et al. | |
| 2005/0225686 A1 | 10/2005 | Brummack et al. | |
| 2006/0066541 A1 | 3/2006 | Gally et al. | |
| 2006/0066783 A1 | 3/2006 | Sampsell | |
| 2006/0066935 A1 | 3/2006 | Cummings et al. | |
| 2006/0130889 A1 | 6/2006 | Li et al. | |
| 2006/0176487 A1 * | 8/2006 | Cummings et al. | 356/445 |
| 2006/0180886 A1 | 8/2006 | Tsang | |
| 2006/0201546 A1 | 9/2006 | Yokoyama | |
| 2006/0262562 A1 | 11/2006 | Fukasawa et al. | |
| 2006/0274400 A1 | 12/2006 | Miles | |
| 2007/0077525 A1 | 4/2007 | Davis et al. | |
| 2007/0113887 A1 | 5/2007 | Laih et al. | |
| 2007/0125415 A1 | 6/2007 | Sachs | |
| 2007/0132843 A1 | 6/2007 | Miles | |
| 2007/0153860 A1 | 7/2007 | Chang-Hasnain | |
| 2007/0171418 A1 | 7/2007 | Nyhart | |
| 2007/0196040 A1 | 8/2007 | Wang et al. | |
| 2007/0206267 A1 | 9/2007 | Tung et al. | |
| 2007/0235072 A1 | 10/2007 | Bermel et al. | |
| 2007/0247704 A1 | 10/2007 | Mignard | |
| 2007/0285761 A1 | 12/2007 | Zhong et al. | |
| 2008/0030657 A1 | 2/2008 | Wu et al. | |
| 2008/0105298 A1 | 5/2008 | Lu et al. | |
| 2008/0279498 A1 | 11/2008 | Sampsell et al. | |
| 2009/0078316 A1 | 3/2009 | Khazeni | |
| 2009/0101192 A1 | 4/2009 | Kothari | |
| 2009/0103161 A1 | 4/2009 | Kothari | |
| 2009/0151771 A1 | 6/2009 | Kothari | |
| 2009/0159123 A1 | 6/2009 | Kothari | |
| 2009/0219604 A1 | 9/2009 | Miles | |
| 2009/0242024 A1 | 10/2009 | Kothari | |
| 2009/0251761 A1 | 10/2009 | Khazeni et al. | |
| 2009/0293955 A1 | 12/2009 | Kothari | |
| 2010/0051089 A1 | 3/2010 | Khazeni et al. | |
| 2010/0096006 A1 | 4/2010 | Griffiths | |
| 2010/0096011 A1 | 4/2010 | Griffiths et al. | |
| 2010/0214642 A1 | 8/2010 | Miles | |
| 2010/0236624 A1 | 9/2010 | Khazeni et al. | |

FOREIGN PATENT DOCUMENTS

| | | |
|---|---|---|
| DE | 10 2006 039 071 | 2/2008 |
| EP | 0 223 136 | 5/1987 |
| EP | 0 622 856 | 11/1994 |
| EP | 0 843 364 | 5/1998 |
| EP | 1 275 997 | 1/2003 |
| EP | 1 369 932 | 12/2003 |
| EP | 1 403 212 | 3/2004 |
| EP | 1 670 065 | 6/2006 |
| EP | 1 691 429 A | 8/2006 |
| EP | 2 012 167 | 1/2009 |
| EP | 2 051 124 | 4/2009 |
| GB | 2 396 436 | 6/2004 |
| JP | 56-088111 | 7/1981 |
| JP | 60 147718 | 8/1985 |
| JP | 60-147718 | 8/1985 |
| JP | 02-151079 | 6/1990 |
| JP | 04-190323 | 7/1992 |
| JP | 04-238321 | 8/1992 |
| JP | 8-051230 | 2/1996 |
| JP | 08-094992 | 4/1996 |
| JP | 08 094992 | 4/1996 |
| JP | 09-068722 | 3/1997 |
| JP | 09 068722 | 3/1997 |
| JP | 09-281917 | 10/1997 |
| JP | 11 295725 | 10/1999 |
| JP | 11-295725 | 10/1999 |
| JP | 11-295726 | 10/1999 |
| JP | 2001-345458 | 12/2001 |
| JP | 05-308871 | 11/2005 |
| JP | 2006-065360 | 3/2006 |
| JP | 2006-065360 A | 3/2006 |
| JP | 2007-334132 | 12/2007 |
| KR | 2003-0081662 | 10/2003 |
| WO | WO 94/28452 | 12/1994 |
| WO | WO 95/15582 | 6/1995 |
| WO | WO 97/44707 | 11/1997 |
| WO | WO 99/04296 | 1/1999 |
| WO | WO 00/11502 | 3/2000 |
| WO | WO 02/27805 | 4/2002 |
| WO | WO 2004/114418 | 12/2004 |
| WO | WO 2006/034377 | 3/2006 |
| WO | WO 2006/137337 | 12/2006 |
| WO | WO 2007/073203 | 6/2007 |
| WO | WO 2008/067024 | 6/2008 |
| WO | WO 2009/052326 | 4/2009 |

OTHER PUBLICATIONS

ISR and WO dated Jun. 19, 2009 in PCT/US08/078498.
Extended European Search Report dated Jun. 19, 2009 in App. No. 08153685.6.
ISR and WO dated Jun. 19, 2009 in PCT/US08/080222.
ISR and WO dated Jun. 19, 2009 in PCT/US08/080225.
Pohlack, Jan. 1, 1983, Grundlagen and anwendungen der induzierten resonanzabsorptoon (teil 1), Feingeraetetechnik, XX, XX, vol. 32, No. 7, pp. 321-326.
IPRP dated Jan. 29, 2010 in PCT/US08/080225.
Nakagawa et al., Wide-Field-of-View Narrow Band Spectral Filters Based on Photonic Crystal Nanocavities, Optical Society of America, Optic Letters, vol. 27, No. 3, pp. 191-193, 2002.
Office Action dated Jul. 19, 2010 in U.S. Appl. No. 11/966,850.
IPRP dated Jan. 29, 2010 in PCT/US08/078498.
Office Action dated Feb. 4, 2010 in U.S. Appl. No. 12/254,766.
IPRP dated Jan. 29, 2010 in PCT/US08/080222.
Chemical Properties Handbook, McGraw-Hill, 1999, Refractive Index, Dipole Moment and Radius of Gyration; Inorganic Compounds, No. 151: O2Si.

International Preliminary Report on Patentability from PCT/US08/080225 dated Jan. 29, 2010.
Office Action dated May 2, 2011 in U.S. Appl. No. 12/254,766.
Office Action dated Aug. 18, 2011 in Chinese App. No. 200880112220.6.

Office Action dated May 25, 2011 in Chinese App. No. 200880112219.3.

* cited by examiner

DISPLAY WITH INTEGRATED PHOTOVOLTAICS

CROSS-REFERENCE TO RELATED APPLICATIONS

This application claims priority under 35 U.S.C. §119(e) to U.S. Provisional Application Ser. No. 60/999,566 filed on Oct. 19, 2007, titled "COLORED PHOTOVOLTAICS USING INTERFEROMETRIC DISPLAY DEVICES AND PHOTOVOLTAIC INTEGRATED INTERFEROMETRIC DISPLAYS", the disclosure of which is hereby expressly incorporated by reference in its entirety.

This application is related to U.S. patent application Ser. No. 11/966,850, filed on Dec. 28, 2007, titled "PHOTOVOLTAIC DEVICES WITH INTEGRATED COLOR INTERFEROMETRIC FILM STACKS" and Application titled "DISPLAY WITH INTEGRATED PHOTOVOLTAIC DEVICE" (Ser. No. 12/254,766), filed on even date herewith.

BACKGROUND

1. Field of the Invention

The invention relates generally to display devices for actively displaying images.

2. Description of the Related Technology

Active displays may be made up of pixels that are fully or partly reflective, transmissive, or emissive. Hence a display may generate images with pixels that operate by fully or partially reflecting incident ambient light, pixels that are light-emissive or transmissive pixels where light is generated from within the display and projected upon the transmissive pixels. Reflective display technologies may include, but are not limited to, liquid crystal, MEMS (such as interferometric modulator), electrophoretic (such as e-ink or e-paper), and other display technologies using reflected ambient light to generate an image. Emissive displays include displays with a backlight to illuminate the active transmissive pixels, such as a liquid crystal displays (LCD) or thin film transistor liquid crystal displays (TFT LCD), or displays where the active pixels themselves generate or emit light such as vacuum fluorescent, light emitting diode (LED), organic light emitting diode (OLED), or surface-conduction electron-emitter displays.

Displays can include MEMS devices, such as an interferometric modulator. As used herein, the term interferometric modulator or interferometric light modulator refers to a device that selectively absorbs and/or reflects light using the principles of optical interference. In some arrangements, an interferometric modulator may comprise a pair of conductive plates, one or both of which may be transparent and/or reflective in whole or part and capable of relative motion upon application of an appropriate electrical signal. For example, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In one embodiment a display device displays an image toward a front side, with a back side opposite the front side. The display device includes a display and a photovoltaic cell. The display includes an array region, the array region including active pixel areas and inactive areas. The photovoltaic cell includes a photovoltaic material. The photovoltaic material is formed over one of the front side and the back side of the array region. The photovoltaic material is patterned.

In another embodiment, a method of manufacturing a display device is provided. The display device configured to display an image toward a front side, with a back side opposite the front side. The method includes providing a display comprising an array region. The array region comprises active pixel areas and inactive areas. The method also includes disposing a patterned photovoltaic material over one of the front side and the back side of the array region.

In yet another embodiment, a method of collecting light for conversion to electricity is provided. The method includes receiving light in a patterned photovoltaic material at one of a front side and a back side of an array region of a display. The method also includes converting the light into electricity.

In an alternative embodiment, a display device displays an image toward a front side, with a back side opposite the front side. The display device includes a means for displaying a mutable pixelated image and a means for converting light into electricity. The converting means is patterned and positioned over one of a front and a back side of the displaying means.

BRIEF DESCRIPTION OF THE DRAWINGS

Example embodiments disclosed herein are illustrated in the accompanying schematic drawings, which are for illustrative purposes only. The following figures are not necessarily drawn to scale.

DETAILED DESCRIPTION OF CERTAIN EMBODIMENTS

Figure 1:
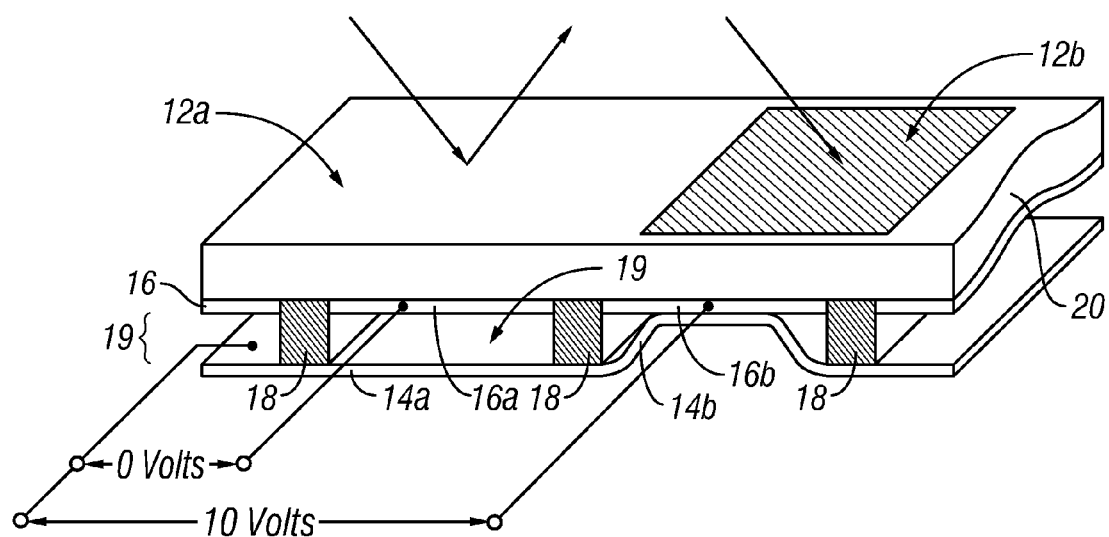
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

Although certain embodiments and examples are discussed herein, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein. The following detailed description is directed to certain specific embodiments of the invention. However, the invention can be embodied in a multitude of different ways. The embodiments described herein may be implemented in a wide range of display devices.

In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry).

Photovoltaic (PV) material is integrated with active displays such as emissive, transmissive, and reflective or partially reflective (transflective) displays. The PV material is patterned to collect light in inactive areas of the display, such as gaps, spaces, holes, spacers, pillars, posts, rails, or other support structures formed from a transparent or translucent material such as air, silicon dioxide, or other material. The PV material may be formed in front of or behind the display. The PV material may be formed in a pattern corresponding to at least some of the inactive areas of the display.

Initially, FIGS. 1-7F illustrate some basic principles of interferometric modulator (IMOD) displays. FIGS. 8-9 illustrate some basic principles of PV cells and devices. FIGS. 10-17B illustrate embodiments in which displays are integrated with patterned photovoltaic (PV) material that serves to mask inactive areas of IMOD or other types of displays.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b (also known as "mirrors" or "reflectors") may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms. The partially reflective layer may also be referred to as an optical absorber. Hence an active interferometric modulator may be said to comprise, in some embodiments, an absorber and a reflector, separated by a variable optical cavity or gap.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
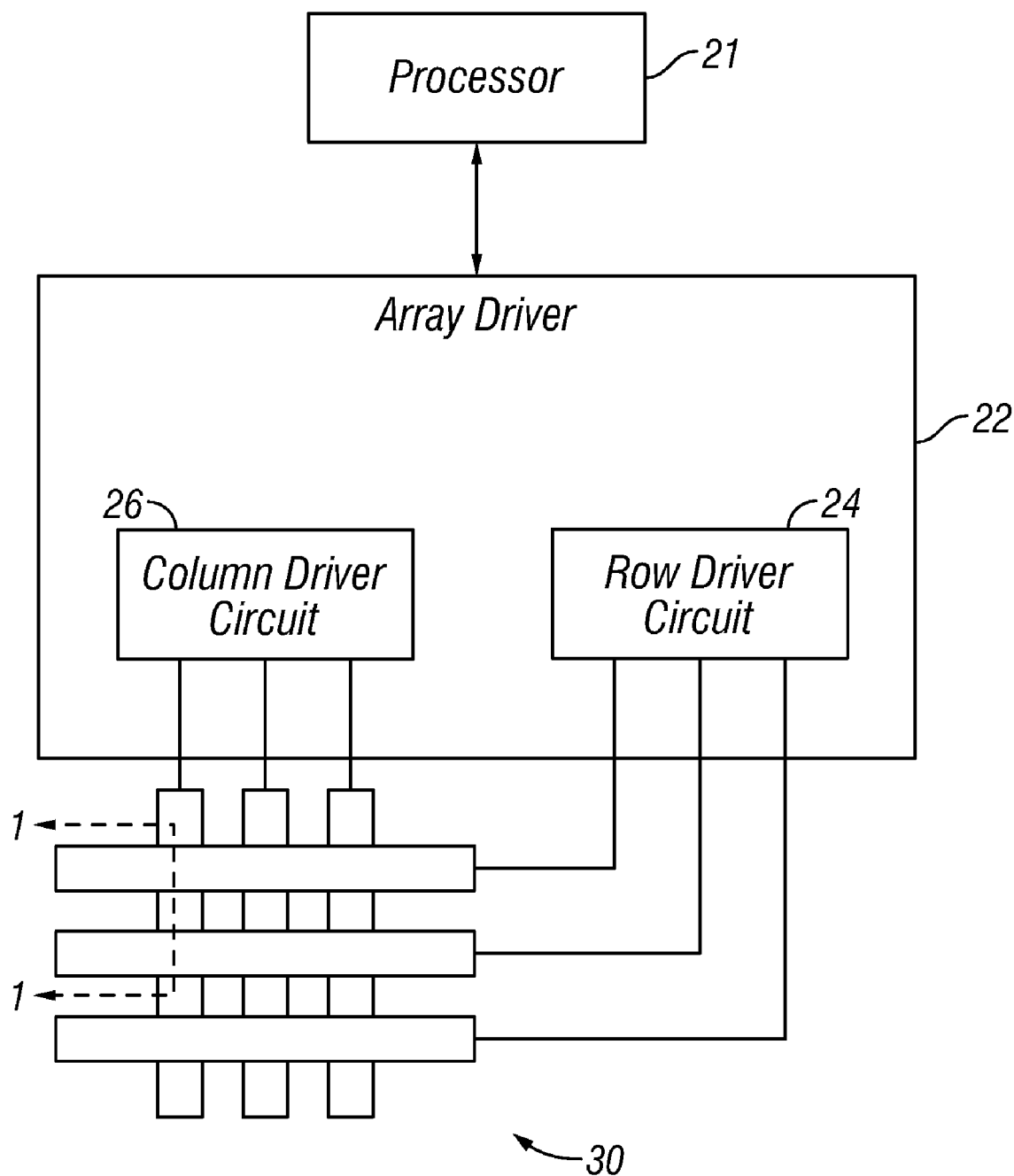
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
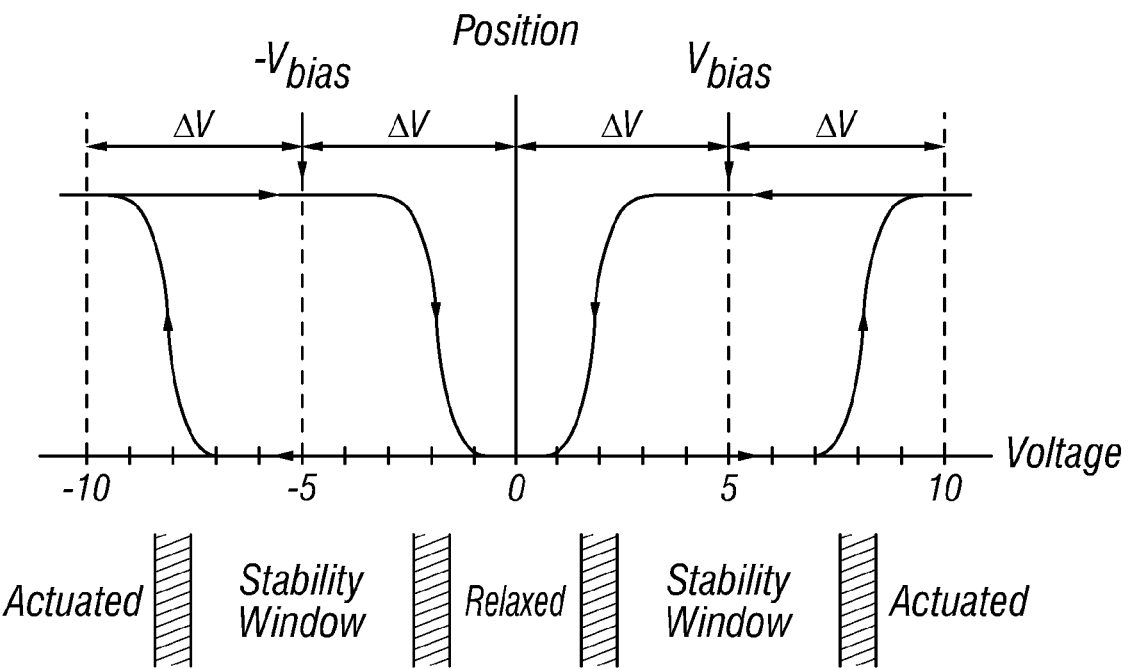
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
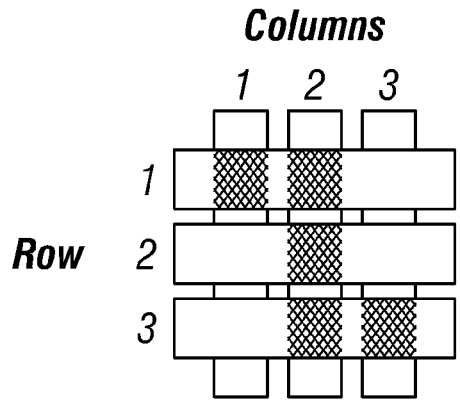
FIGS. 5A and 5B illustrate one exemplary timing diagram for row and column signals that may be used to write a frame of display data to the 3×3 interferometric modulator display of FIG. 2.
Figure 5B:
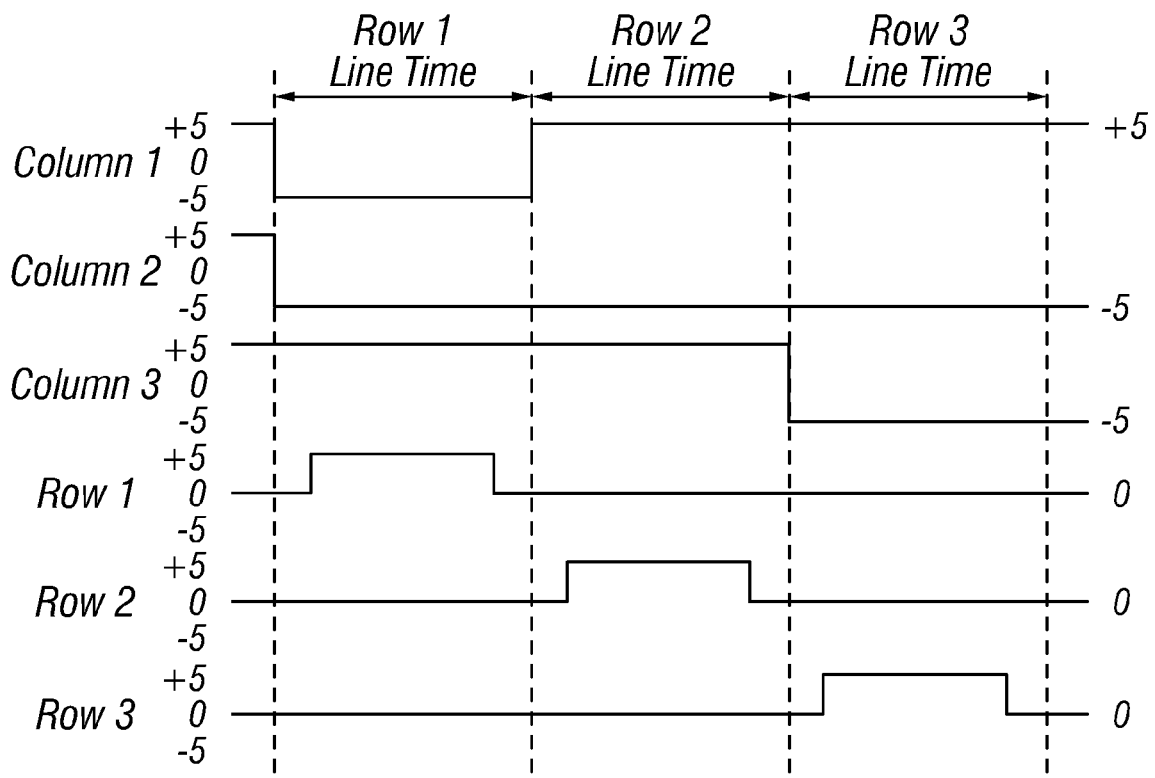

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
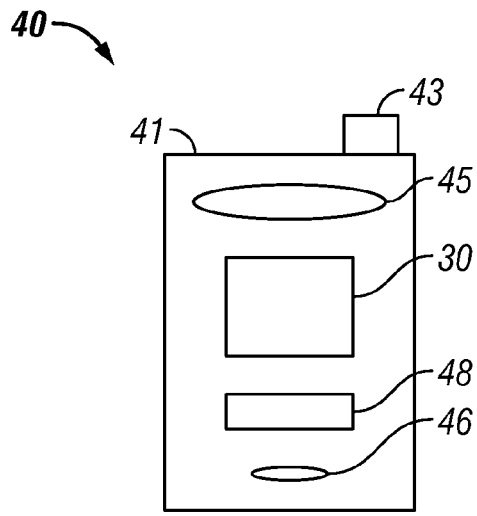
FIGS. 6A and 6B are system block diagrams illustrating an embodiment of a visual display device comprising a plurality of interferometric modulators.
Figure 6B:
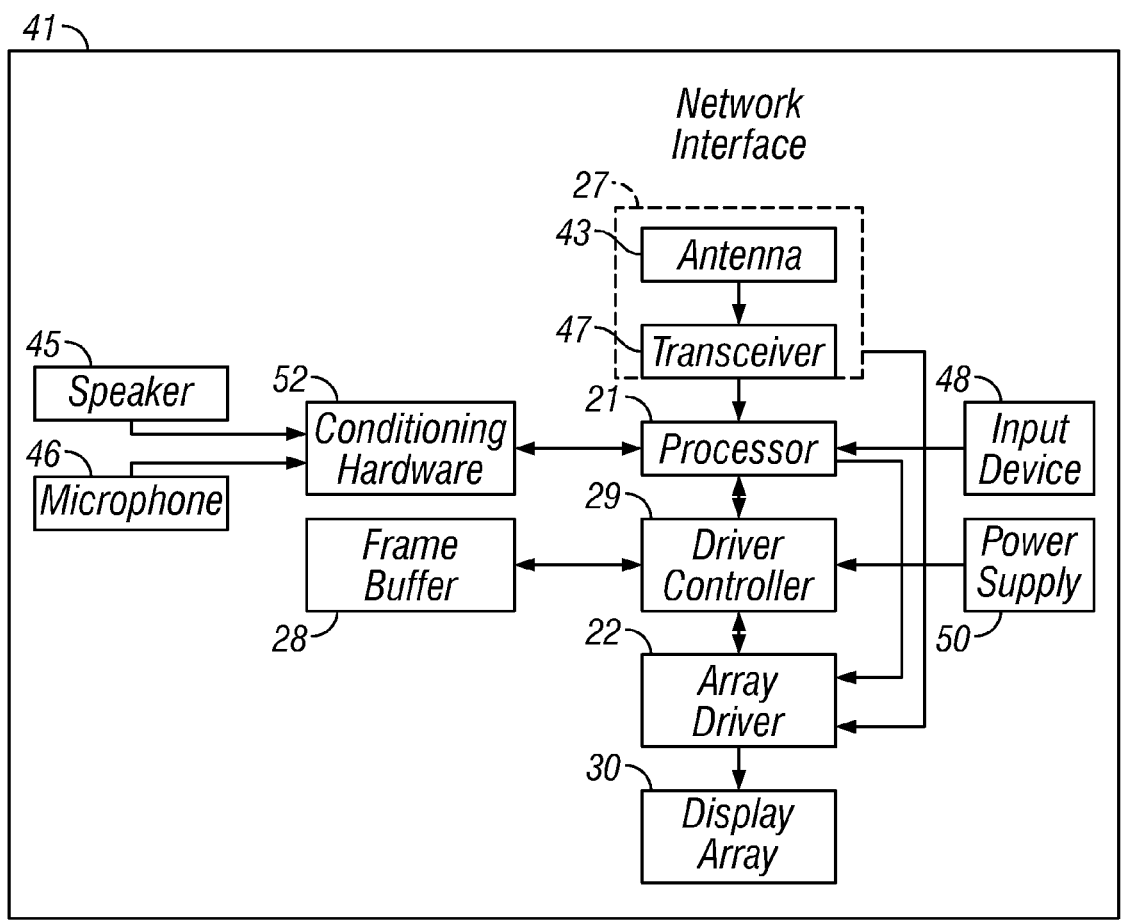
Figure 7A:
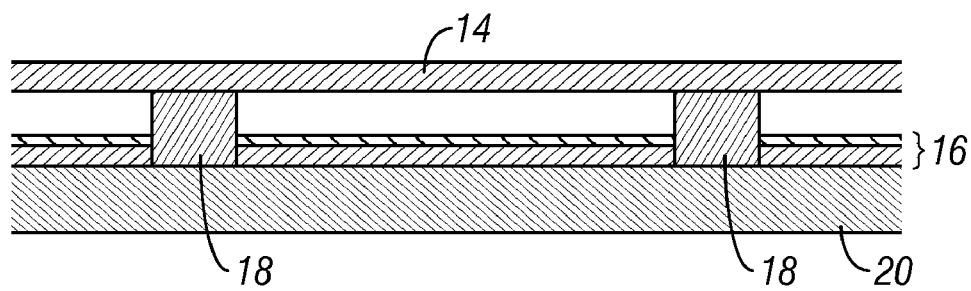
FIG. 7A is a cross section of the device of FIG. 1.
Figure 7B:
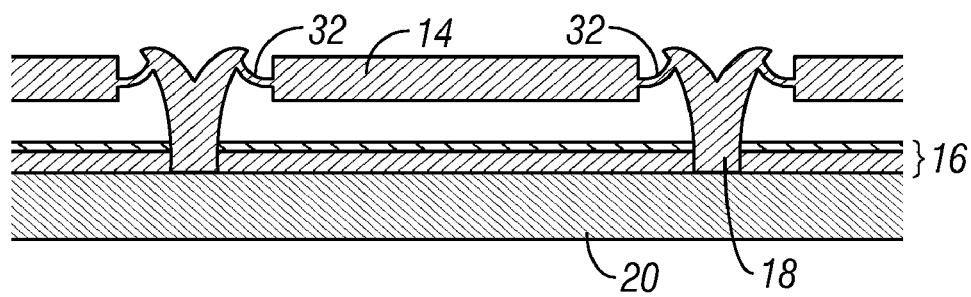
FIG. 7B is a cross section of an alternative embodiment of an interferometric modulator.
Figure 7C:
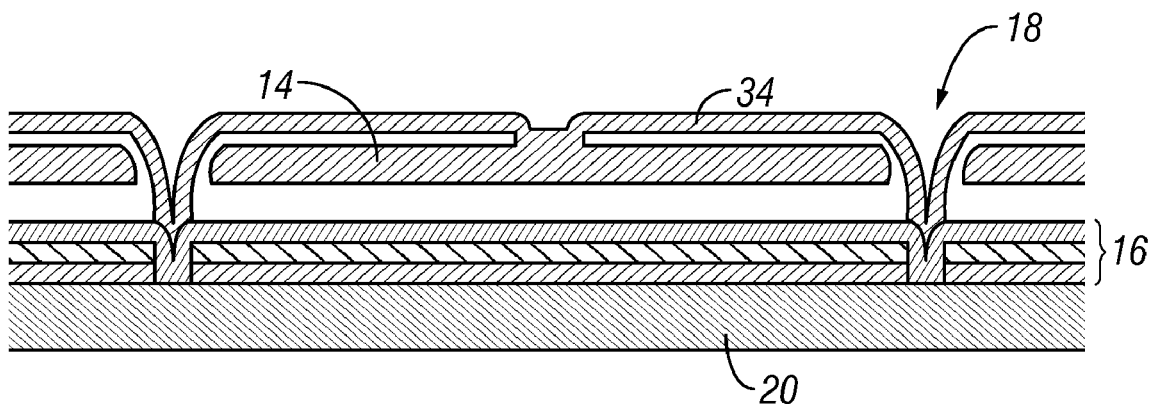
FIG. 7C is a cross section of another alternative embodiment of an interferometric modulator.
Figure 7D:
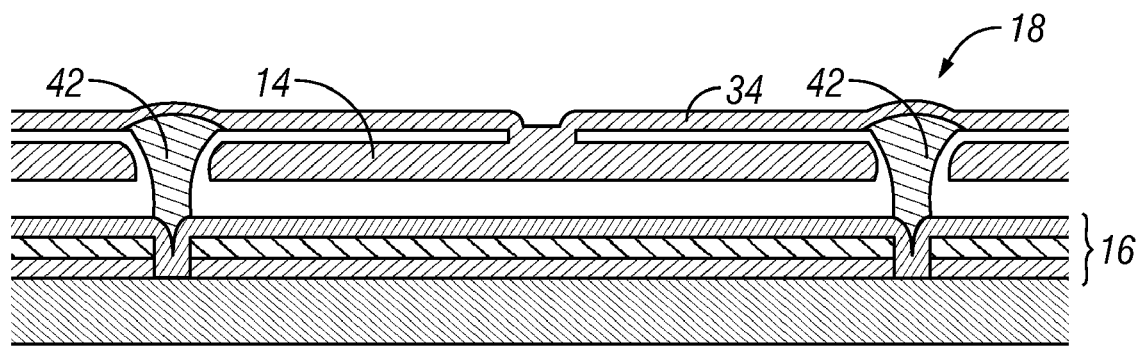
FIG. 7D is a cross section of yet another alternative embodiment of an interferometric modulator.
Figure 7E:
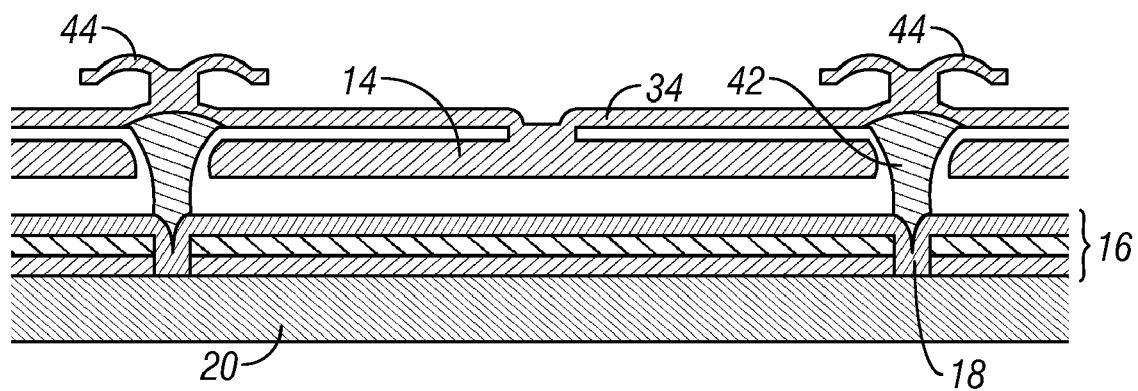
FIG. 7E is a cross section of an additional alternative embodiment of an interferometric modulator.

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22 and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material serving as both the mechanical and movable reflective layer 14 is deposited on orthogonally extending supports 18. In FIG. 7B, the moveable reflective layer 14 of each interferometric modulator is square or rectangular in shape and attached to supports 18 at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as supports 18, which can take the form of posts, rails or walls. The embodiment illustrated in FIG. 7D the supports 18 include support post plugs 42 upon which the deformable layer 34 rests. The movable reflective layer 14 remains suspended over the optical cavity or gap, as in FIGS. 7A-7C, but the deformable layer 34 does not form the supports by filling holes between the deformable layer 34 and the optical stack 16. Rather, the supports 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7F:
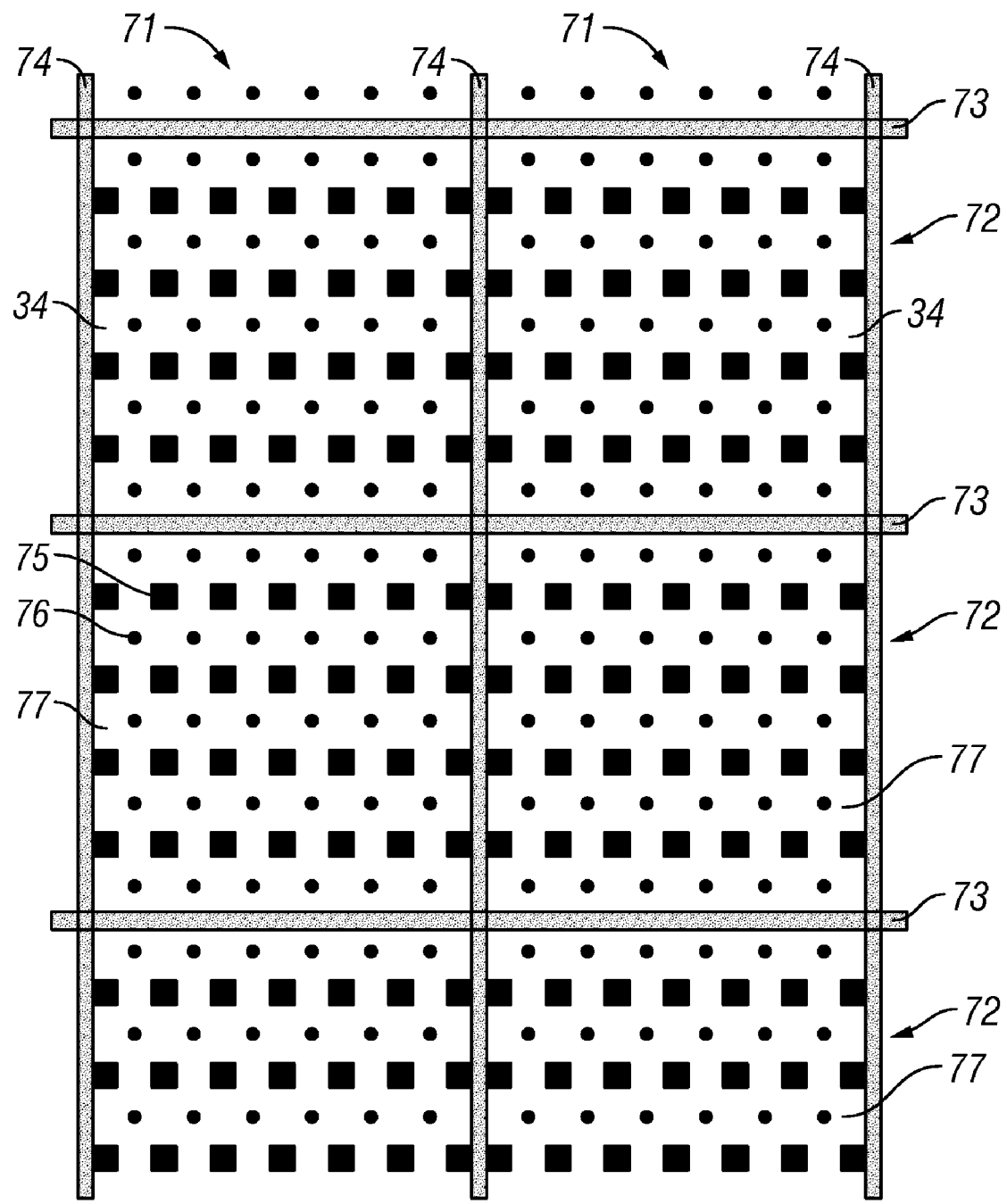
FIG. 7F is a bottom plan view of an array of interferometric modulators.
Figure 8:
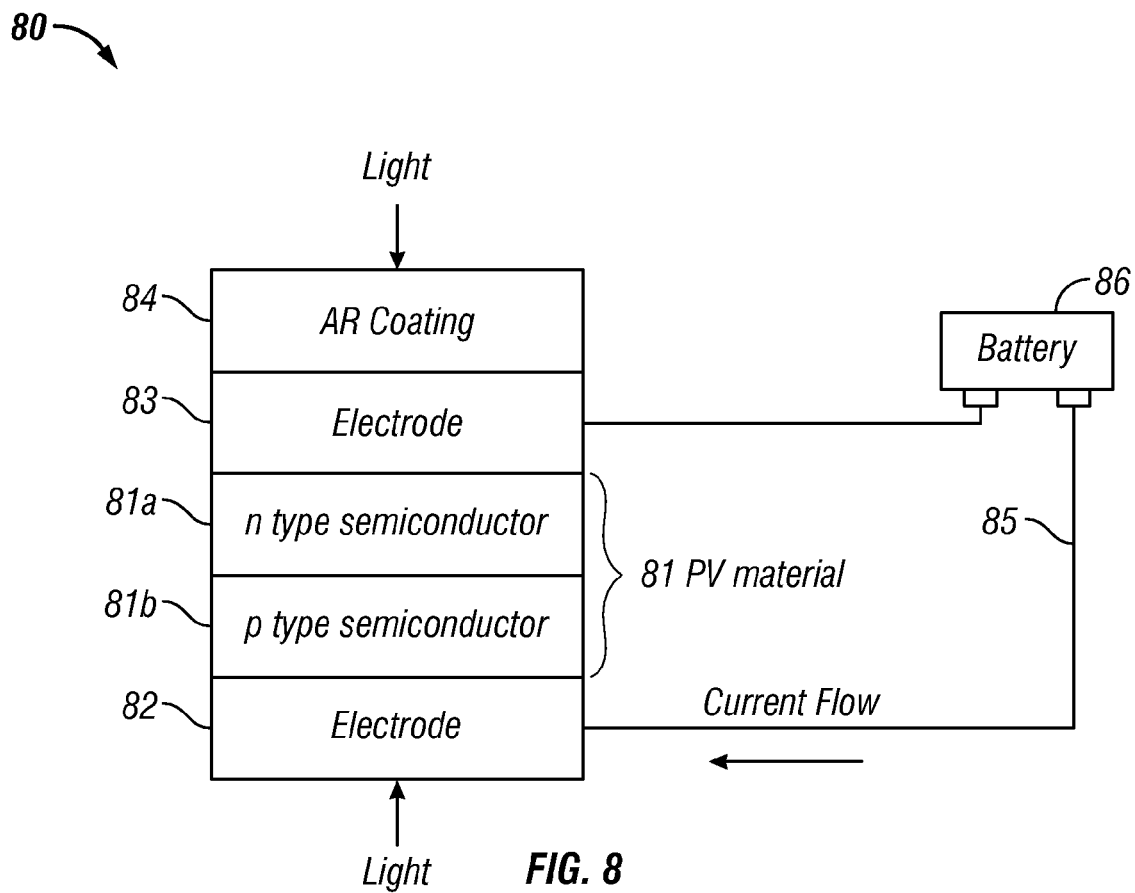
FIG. 8 schematically illustrates a photovoltaic cell comprising a p-n junction.

FIG. 7F illustrates a view from behind an array of interferometric modulators. Four complete pixels are shown of a larger array arranged in a grid. It can be seen that the deformable or mechanical layer 34 (which may also serve as the movable reflector 14 in simple embodiments like FIG. 7A) has been patterned to form column electrodes 71. Conductive layers (see optical stack 16 of FIG. 1), located below the air gap, have been patterned to form row electrodes 72, separated in FIG. 7F by rail supports 73, which permit actuation of specific portions of the deformable layer. Gaps 74 separate strips of the column electrodes 71. Pillars or support structures 75 may be formed within a particular pixel to stiffen the mechanical layer. In addition, etch holes 76 are formed through the mechanical layer 34 throughout the array. Upon actuation of the deformable reflective layer, causing portions of the column electrodes 71 to move towards the row electrodes 72, the actuated portions of the array may appear dark throughout the array. It will be understood, however, that different configurations may be used, such that the array is switchable between reflecting a first color in an unactuated position, and a second color in an actuation position, and that the actuated position need not cause a dark state if different dimensions or materials are utilized. Rail supports 73 and gaps 74 form inactive areas between active pixels 77. Regions within active pixels 77 may also be considered "inactive areas," such as support structures 75, and, if there is no independent hanging reflector 14, etch holes 76. In fact, the region immediately surrounding each support structure 75 and immediately adjacent the rail supports 73 can also be considered "inactive" because the mirror layer cannot completely collapse in these areas and it is desirable to mask peripheral regions surrounding support structures so that they do not behave differently between actuated and unactuated states. As will be discussed further below, the emission, reflection, or transmission of light from inactive or inactive areas may degrade the perception of an image by a viewer.

Certain embodiments disclosed herein include photovoltaic (PV) cells or devices integrated with displays comprising MEMS, LCD, LED, or other display technology. Such displays may actively display images or information while simultaneously collecting ambient and/or display-generated light for conversion into electricity. Hence an active (programmable) outdoor display may advantageously convert unused sunlight to electricity, or a display on a mobile device may help offset standby power usage by collecting ambient light. Furthermore, the absorption of light by PV material integrated with displays may be used to mask unwanted or extraneous light that can degrade an image, as explained further below. Thus the manufacturing costs of integrating PV material with the display can be at least partially offset by omitting separate steps for forming masks in inactive regions of the display image area.

In some embodiments, patterned PV cells may overlie the display image regions, e.g., the part of a display which displays an actively changeable image. The image regions that display an actively changeable image exclude areas outside the array of active pixels, such as the periphery of the display, but include inactive regions between active pixels. PV active materials are included within the active image regions or array areas of display devices to capture, and convert to electricity, unused ambient or display-generated light. Depending upon the active display technology, up to 30% or more of the display array region's surface area may actually be made up of inactive regions or areas that do not contribute to the pixilated image or information displayed. This means that up to 30% or more of ambient light incident upon active image regions of a display is "wasted," and may therefore be captured by a PV material for useful conversion to electricity. This may be accomplished by placing a patterned PV material behind the display, allowing the ambient light incident upon the display to shine or transmit through inactive regions of the display and onto the patterned PV material underneath.

Alternatively, a patterned PV material may be formed in front of inactive areas the otherwise wasted light that falls on inactive areas of the display may then be masked by the patterned PV material. Light in these may in fact degrade the image of a display device. Hence, it is advantageous to form a black mask to mask these inactive regions to prevent unwanted emission or reflections toward the viewer. Preferably, a black mask may comprise a photovoltaic material to form a PV black mask so that the unwanted light is not only absorbed to maintain the desired contrast, but is advantageously converted into useful electricity.

FIG. 8 schematically shows an example of a photovoltaic (PV) cell 80. A typical photovoltaic cell can convert light energy into electrical energy or current. A PV cell 80 is an example of a renewable source of energy that has a small carbon footprint and has less impact on the environment. Using PV cells can reduce the cost of energy generation. PV cells can have many different sizes and shapes, e.g., from smaller than a postage stamp to several inches across. PV modules can include electrical connections, mounting hardware, power-conditioning equipment, and batteries that store solar energy for use when the sun is not shining.

A typical PV cell 80 comprises PV material 81 disposed between two electrodes 82, 83. In some embodiments, the PV cell 80 comprises a substrate on which a stack of layers is formed. The PV material 81 of a PV cell 80 may comprise a semiconductor material such as silicon. In some embodiments, the active region may comprise a p-n junction formed by contacting an n-type semiconductor material 81$a$ and a p-type semiconductor material 81$b$ as shown in FIG. 8. Such a p-n junction may have diode-like properties and may therefore be referred to as a photodiode structure as well.

The PV material 81 is generally sandwiched between two electrodes that provide an electrical current path. The electrodes 82, 83 can be formed of aluminum, silver, molybdenum or some other conducting material. The electrodes 82, 83 may also be formed of or include a transparent conducting material. The electrodes 82, 83 may be designed to cover a significant portion of the front surface of the p-n junction so as to lower contact resistance and increase collection efficiency. In embodiments wherein the electrodes 82, 83 are formed of an opaque material, the electrodes 82, 83 may be configured to leave openings over the front of the PV material to allow illumination to impinge on the PV material. In some embodiments, the back or front electrodes 82, 83 can include a transparent conductor, for example, transparent conducting oxide (TCO) such as tin oxide ($SnO_2$) or indium tin oxide (ITO). The TCO can provide electrical contact and conductivity and simultaneously be transparent to the incoming light. The illustrated, the PV cell 80 also comprises an anti-reflective (AR) coating 84 disposed over the front electrode 83, although the AR coating may also optionally be disposed over the back electrode 82 in embodiments where light may be expected to be incident on or transmissive through the back of the PV cell 80 (as in the front and back PV black masks 110, 115 in FIGS. 12 and 13 discussed further below). The AR coating 84 can reduce the amount of light reflected from the front surface of the PV active material 81.

When the PV material 81 is illuminated, photons transfer energy to electrons in the active region. If the energy transferred by the photons is greater than the band-gap of the semiconducting material, the electrons may have sufficient energy to enter the conduction band. An internal electric field is created with the formation of the p-n junction. The internal electric field operates on the energized electrons to cause these electrons to move, thereby producing a current flow in an external circuit 85. The resulting current flow can be used to power various electrical devices. For example, the resulting current flow may be stored for later use by charging a battery 86 or a capacitor as shown in FIG. 8, which in turn can power the display.

The PV material(s) can be include any of a variety of light absorbing, photovoltaic materials such as crystalline silicon (c-silicon), amorphous silicon (a-silicon), germanium (Ge), Ge alloys, cadmium telluride (CdTe), copper indium diselenide (CIS), copper indium gallium diselenide (CIGS), light absorbing dyes and polymers, polymers dispersed with light absorbing nanoparticles, or tandem multi-junction photovoltaic materials and films. The PV active material 81 may comprise other appropriate materials, including III-V semiconductor materials include such materials as gallium arsenide (GaAs), indium nitride (InN), gallium nitride (GaN), boron arsenide (BAs). Semiconductor alloys like indium gallium nitride may also be used. Other photovoltaic materials and devices are also possible. Methods of forming these materials are known to those having skill in the art. As an illustrative example, alloys like CIGS can be formed by a vacuum-based process where copper, gallium, and indium are co-evaporated or co-sputtered then annealed with a selenide vapor to form the CIGS structure. Non-vacuum-based alternative processes are also known to those of skill in the art. A deposited thin film PV active material can comprise, for example, an amorphous silicon thin film, which has recently been gaining in popularity. Amorphous silicon as thin films can be deposited over large areas by physical vapor deposition (PVD), chemical vapor deposition (CVD), electrochemical vapor deposition, or plasma-enhanced chemical vapor deposition (PECVD), among other techniques. As is known by those with skill in the art, PV active materials comprising amorphous silicon layers may include one or more junctions with n-doped and/or p-doped silicon and may further comprise p-i-n junctions. Other materials may also be used. The light absorbing material(s) where photons are absorbed and transfer energy to electrical carriers (holes and electrons) is referred to herein as the PV material or material of the PV cell, and this term is meant to encompass multiple active sub-layers. The material for the PV material can be chosen depending on the desired performance and the application of the PV cell.

Figure 9A:
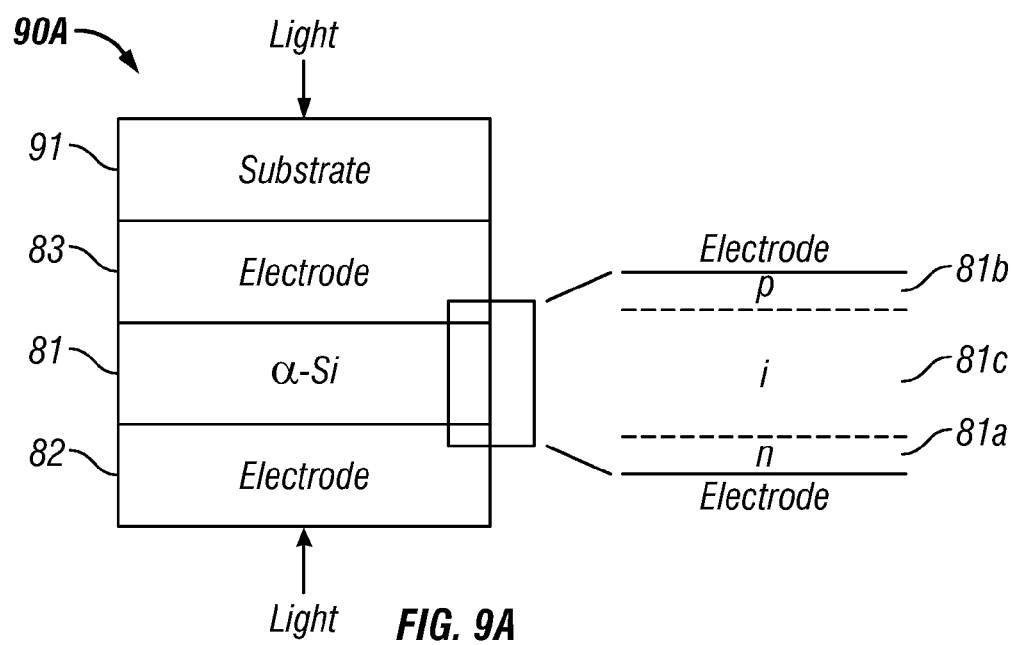
FIG. 9A is a block diagram that schematically illustrates a photovoltaic cell comprising a deposited thin film photovoltaic active material.

FIG. 9A is a block diagram schematically illustrating a typical thin film PV cell 90B. The typical thin film PV cell 90B includes a glass substrate 91 through which light can pass. Disposed on the glass substrate 91 are a first electrode layer 83, a PV material 81 (shown as comprising amorphous silicon), and a second electrode layer 82. The first electrode layers 83 can include or be formed by a transparent conducting material such as ITO. As illustrated, the first electrode layer 83 and the second electrode layer 82 sandwich the thin film PV material 81 therebetween. The illustrated PV material 81 comprises an amorphous silicon layer, but other PV thin film materials are also known. As is known in the art, amorphous silicon serving as a PV material may comprise one or more diode junctions. Furthermore, an amorphous silicon PV layer or layers may comprise a p-i-n junction wherein a layer of intrinsic silicon 81c is sandwiched between a p-doped layer 81b and an n-doped layer 81a. A p-i-n junction may have higher efficiency than a p-n junction. In some other embodiments, the PV cell can comprise multiple junctions.

Layers 81, 82, 83 may be deposited using deposition techniques such as physical vapor deposition techniques, chemical vapor deposition techniques, electrochemical vapor deposition techniques, etc. Thin film PV cells may comprise amorphous or polycrystalline materials such as thin-film silicon, CIS, CdTe or CIGS. Some advantages of thin film PV cells are small device footprint and scalability of the manufacturing process among others.

Figure 9B:
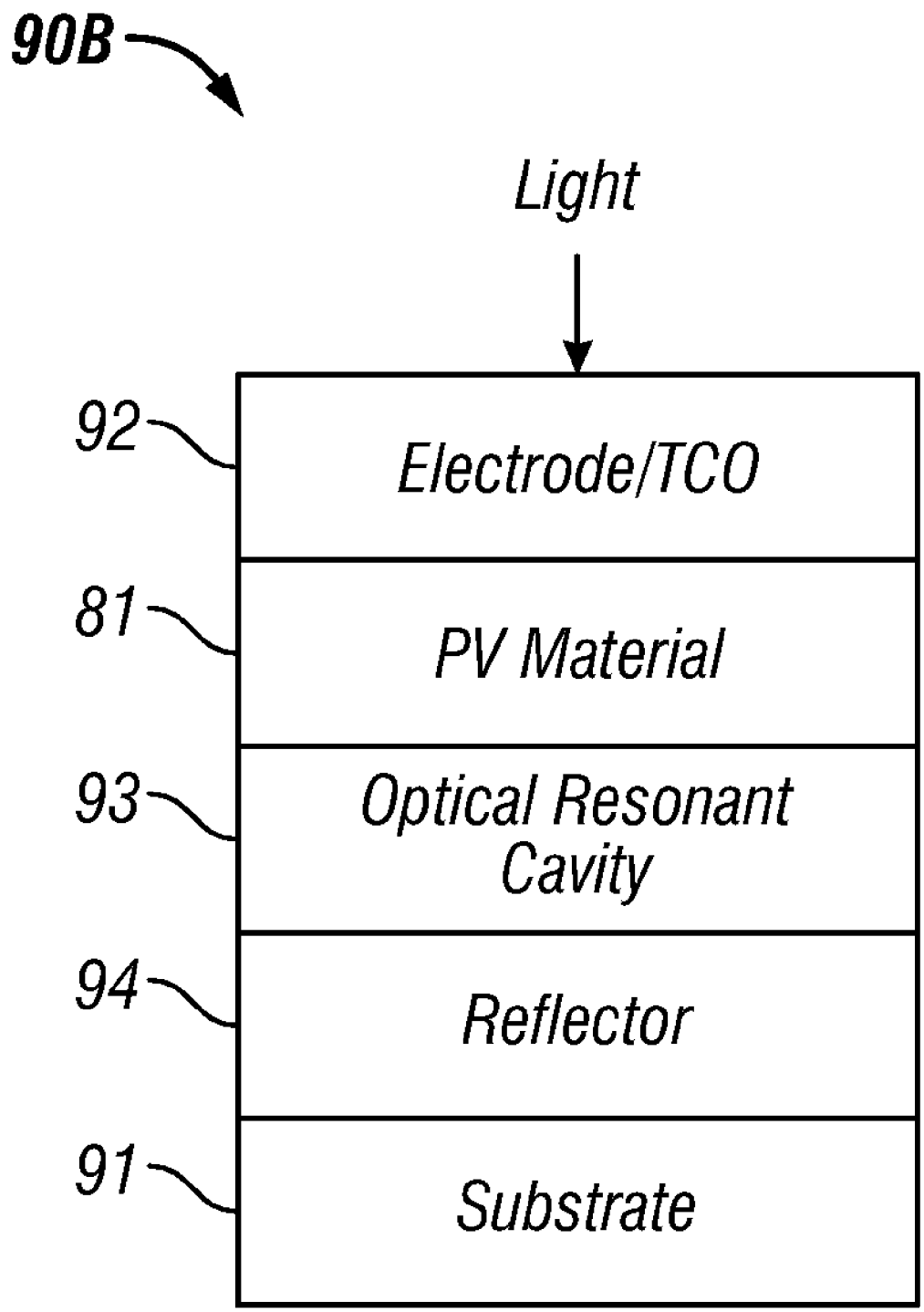
FIG. 9B is a block diagram that schematically illustrates a photovoltaic cell comprising an interferometrically enhanced photovoltaic stack.

FIG. 9B depicts an example of an interferometrically enhanced PV stack or cell 90B. The interferometrically enhanced PV cell 90B includes a PV active material or layer 81. The PV material 81 may comprise a thin film photovoltaic material formed over a substrate 91. An optical resonant cavity 93 and a reflector 94 disposed below the PV material 81 are configured to interferometrically enhance the strength of the electric field in the PV material 81, resulting in an interferometrically enhanced PV cell 90B with improved efficiency. The electrode 92 covering the PV material 81 may be metallic and thick enough to be opaque in some areas to facilitate the conduction of electrons and/or holes out of the PV material 81. Otherwise, the PV material 81 may also be covered with an electrode 92 comprising a transparent conducting oxide (TCO) layer, or both a TCO layer and an opaque electrode. Similarly, the optical resonant cavity 93 may comprise a TCO layer that serves both as a part of an optical resonant cavity 93 as well as a conducting layer for holes and/or electrons to conduct out of the PV material 81. The PV material 81 may comprise a thin film photovoltaic material, such as amorphous silicon, CIGS or other thin semiconductor film photovoltaic material. The optical properties (dimensions and material properties) of the reflector 94 and optical resonant cavity 93 are selected so that reflection from interfaces of the layered PV device 90B coherently sum to produce an increased field of a suitable wavelength distribution and phase in the PV material 81 of the PV cell 90B where optical energy is converted into electrical energy. Such interferometrically enhanced photovoltaic devices increase the absorption of optical energy in the active region of the interferometric photovoltaic cell and thereby increase the efficiency of the device. In variations on this embodiment, multiple optical resonant cavities can be employed to separately tune different wavelengths of light and maximize absorption in the PV material(s). The buried optical resonant cavities and/or layers may comprise transparent conductive or dielectric materials, air gaps, or combinations thereof.

Given that certain advantages may be obtained by integrating PV cells with displays, the embodiments below describe incorporating or integrating photovoltaic cells with display devices. Photovoltaic cells may be arranged so as to capture light incident upon, reflected from, or generated by the display and convert it to electricity. Furthermore, as explained further below, many displays are susceptible to light being emitted or reflected toward a viewer in areas between pixels. This unwanted light can reduce the image quality and/or contrast of a display and degrade the image generated by the display. As a result, displays can include black masks to mask this unwanted or extraneous light from reaching a viewer. Since PV materials can absorb this extraneous light, PV materials may be used as a black mask for an emissive, reflective or transmissive display. Not only would a PV black mask absorb the unwanted light, but the PV black mask may advantageously convert the absorbed light into electricity, thus serving dual functions and saving the need for additional black mask formation.

Figure 10:
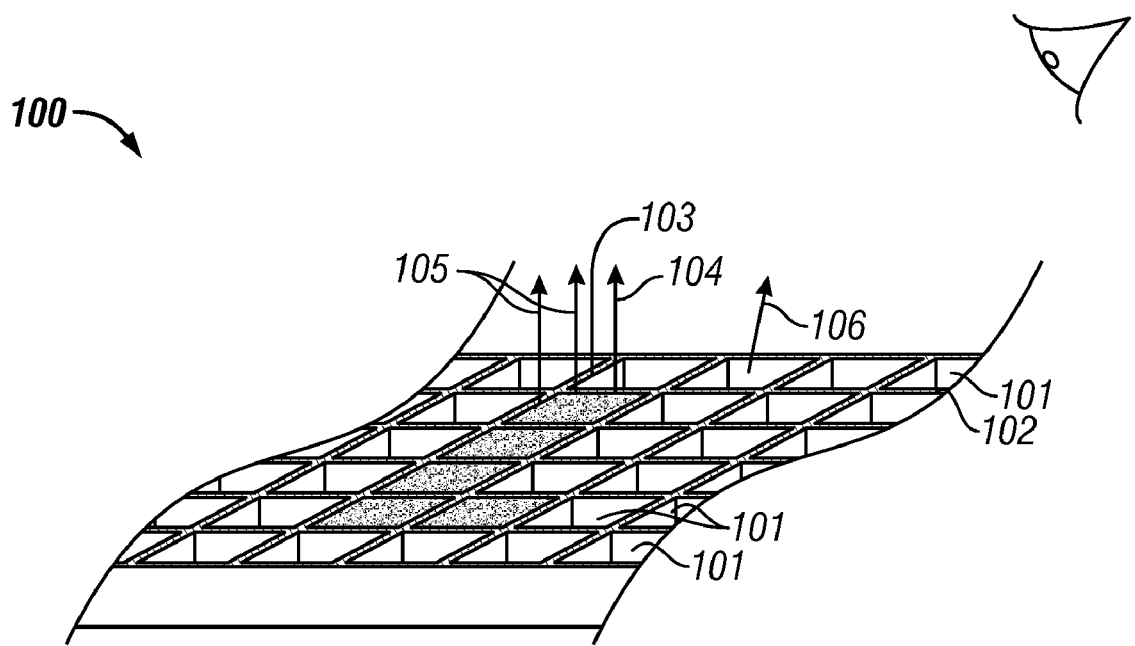
FIG. 10 illustrates a display with an array of active pixels and inactive areas between pixels.

FIG. 10 depicts a generalized schematic of a display device 100 displaying an image toward a front or image side of the device. As shown, the display device 100 comprises an array region comprising active pixels 101. The active pixels 101 may also be referred to as active pixel areas. The display device 100 also includes inactive areas. As illustrated, inactive area grid lines 102, 103 are disposed between or separating adjacent active pixels 101. In embodiments where display device 100 is an interferometric modulator display, inactive areas may comprise gaps between electrodes, peripheral regions at the edges of the pixel array, rails, support structures, or etch holes as discussed above in relation to FIG. 7F. In other embodiments comprising other display technologies, the inactive areas may comprise other areas in a display susceptible to emitting or reflecting extraneous light.

Also shown in FIG. 10 are rays 104 and 105 representing extraneous light that is emitted, reflected, or transmitted towards a viewer. Often, such light 104, 105 is white light, although extraneous light that is directed toward a viewer may be of any color. Such extraneous light may degrade an image displayed on display device 100 by washing out or lowering contrast with pixel areas intended to be bright (in either on or off states). In some embodiments, display device 100 may include black mask material to mask extraneous light 104, 105 such that only light 106 from an active pixel 101 reaches a viewer, and very little extraneous light 104, 105 is directed towards the viewer.

Figure 11:
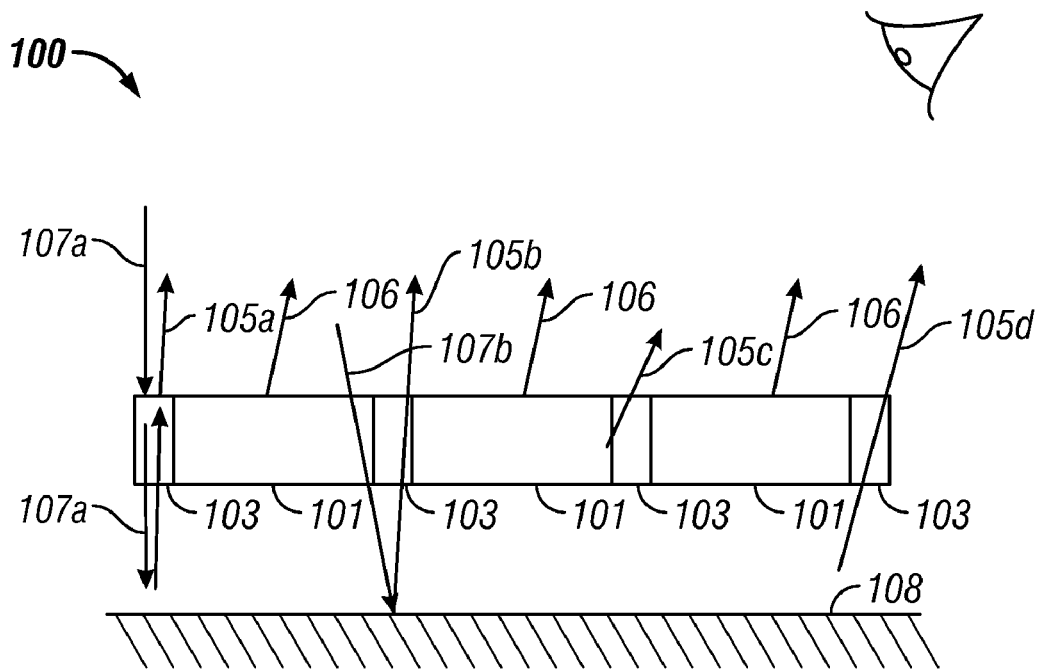
FIG. 11 is a schematic cross-section of a display with an array of active pixels and inactive areas for purposes of illustrating possible sources of extraneous light in inactive areas.

FIG. 11 schematically depicts a cross-section of a generic, active (programmable) display device similar to that of FIG. 10. As shown in FIG. 11, light emitted, reflected, or transmitted from the display toward a viewer may comprise light 106 emitted, reflected, or transmitted from an active pixel 101 to form part of an image. Light emitted, reflected, or transmitted toward the viewer may also comprise light 105*a-d* emitted, reflected, or transmitted from inactive areas 103. Light 105*a-d* from inactive areas may wash out or reduce contrast in the image displayed toward the viewer. It is therefore desirable to mask these areas to block or absorb extraneous light 105*a-d*.

Light 105*a-d* may come from many sources. For example, inactive areas 103 may be reflective or semi-reflective. Therefore, a ray 105*a* may result from reflections of incident ambient light 107*a* upon the inactive area 103. In cases where the inactive area 103 is transparent or semi-transparent, light 105*a* may be reflected from a reflective surface or backplate 108 disposed behind the pixels 101. In some cases, incident ambient light 107*b* may pass through a pixel 101 and reflect off of the backplate 108 and then pass through inactive area 103 as depicted by ray 105*b*. In an emissive display, the extraneous light 105*c* may be emitted by the pixel 101, such as in an LED display. In other displays, light may transmit through inactive area 103 from a backlight as shown by ray 105*d*. In all of these embodiments, extraneous light 105*a-d* can reduce contrast or wash out the image. A black mask made of light-absorbing material may be useful in absorbing this light, allowing only pixel light 106 to reach a viewer. Advantageously, a black mask may be made of PV materials so that this extraneous light is not only absorbed, but advantageously used to generate electricity for storage, for helping power the display device 100, or for other uses.

Figure 12:
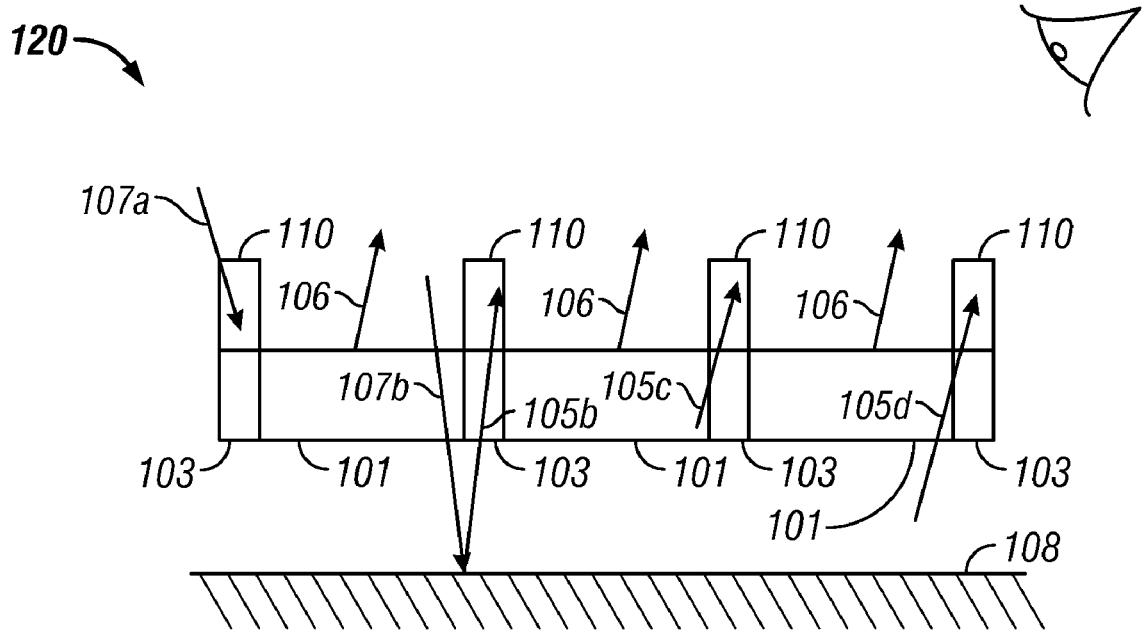
FIG. 12 is a schematic cross-section of a display with an array of active pixels and inactive areas, with a patterned PV black mask formed in front of the active pixels.

FIG. 12 depicts a front PV black mask 110 patterned in front of inactive areas 103 in a PV-integrated display device 120. As shown, the front PV black mask 110 helps to mask inactive areas 103 to absorb extraneous light that would otherwise degrade an image displayed on display device 120. For example, the front PV black mask 110 may absorb incident ambient light 107*a* before it can reflect. The front PV black mask 110 may also help to absorb light 105*b* that reflects off of a backplate 108 or other reflective surface disposed behind the pixels 101. As shown with respect to light rays 107*a* and 105*b*, the PV black mask 110 can be configured to receive light from both the front and back sides of the photovoltaic material. The front PV black mask 110 may further absorb light 105*c*, 105*d* that is emitted from (e.g., an emissive pixel, as in an LED display) or transmitted through (e.g., as in an LCD display where light 105*d* is generated by a backlight) pixels 101 and that strays or scatters out of inactive areas 103. Therefore, as can be seen from FIG. 12, only light 106 emitted by the active pixels 101 reaches the viewer, and the image is enhanced as a result.

Figure 13:
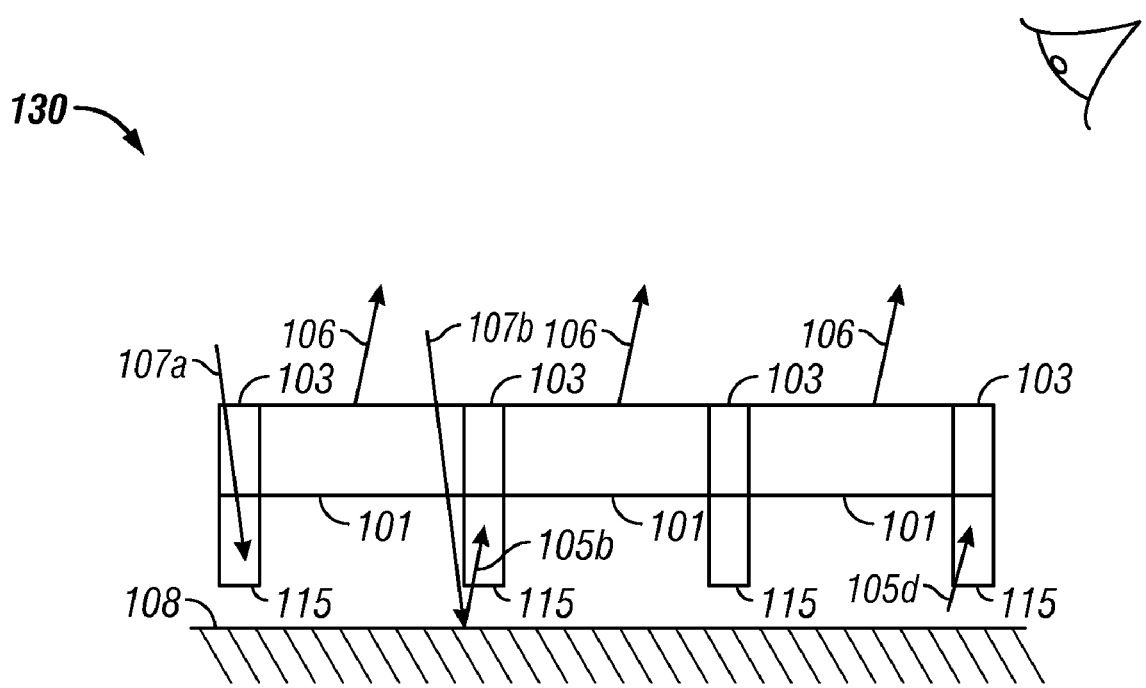
FIG. 13 is a schematic cross-section of a display with an array of active pixels and inactive areas, with a patterned PV black mask formed behind the active pixels.

FIG. 13 depicts a PV-integrated display device 130 similar to that of FIG. 12. However in FIG. 13 a back PV black mask 115 is patterned behind the inactive areas 103. As shown, the back PV black mask 115 can absorb incident ambient light 107*a* before it can reflect. The back PV black mask 115 may also help to absorb light 105*b* that reflects off of a backplate 108 or other reflective surface disposed behind the pixels 101. Hence, as shown with respect to light rays 107*a* and 105*b*, the back PV black mask 115 can be configured to receive light from both the front and back sides of the photovoltaic material. The back PV black mask 115 may further absorb light 105*d* that is generated by the pixels 101 but which strays or scatters to inactive areas 103. Therefore, as can be seen from FIG. 13, only light 106 emitted by the active pixels reaches the viewer, and the image is enhanced as a result. In some embodiments, a PV-integrated display device may comprise both a front and a back PV black mask 110, 115.

The front or back PV black masks 110, 115 depicted in FIGS. 12 and 13 may comprise a photovoltaic cell that includes a photovoltaic material as discussed above. The photovoltaic cell may include an interferometrically enhanced photovoltaic cell. Appropriate photovoltaic materials may preferably include a thin film photovoltaic material as described above (see FIGS. 8-9B), although a semiconductor substrate or epitaxially grown semiconductor material may also be used. Furthermore, as explained above, the photovoltaic material in a PV cell (such as PV black masks 110, 115) may be in contact with electrodes. The photovoltaic material may be "sandwiched" between electrodes. The electrodes in contact with the photovoltaic material may comprise an opaque electrode on one side, e.g., opposite the viewer, opaque electrodes patterned with windows to allow light access to the PV material on either or both sides, and/or a transparent conducting material or film such as a transparent conducting oxide in addition to or in place of such opaque electrodes.

As shown in FIGS. 12 and 13, the PV black mask 110, 115 is patterned to expose the active pixels 101. For example, in some embodiments, the display is a reflective display and the PV black mask 110 is formed in front of (on the image side of) the pixels. In such an embodiment, the PV black mask 110 is patterned to expose the pixels 101 to incident ambient or front light, which is selectively reflected to the viewer to generate an image. In other embodiments, the display is transmissive and the PV black mask 115 is formed behind the pixels. In such an embodiment, the PV black mask 115 is patterned to expose the pixels 101 to light from behind the pixel, e.g., a backlight. To properly improve the image by blocking or absorbing extraneous light, the PV black mask 110, 115 preferably is configured to reflect or transmit less than 10% of the light incident upon the PV black mask 110, 115. More preferably, the PV black mask 110, 115 is configured to reflect or transmit less than 5% of the visible light incident upon the PV black mask 110, 115. The reflection or transmission of the PV cell comprising the PV black mask 110, 115 may depend on such factors as the thickness of the photovoltaic material in the PV cell as well as the materials used. The PV black mask may also include an anti-reflective coating to reduce reflections further.

In FIGS. 12 and 13, the PV black mask 110, 115 is patterned to mask the inactive areas 103 of the array or image region. Therefore PV black mask is patterned to correspond to the pattern of inactive areas 103 such that the undesirable optical effects of inactive areas (e.g., reflections) are masked from the viewer.

Figure 14:
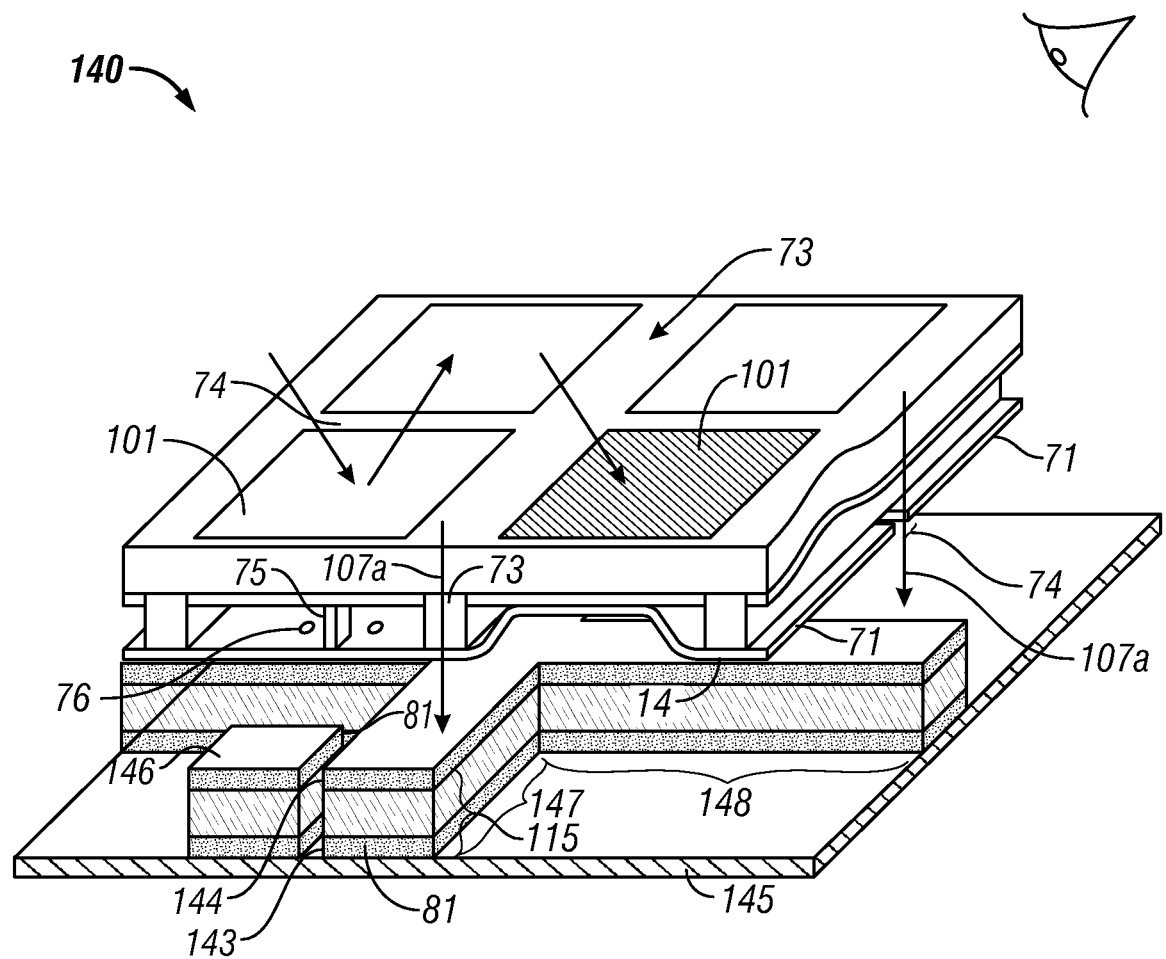
FIG. 14 is a schematic isometric view of an interferometric array with a patterned PV black mask formed behind the array.

FIG. 14 shows a perspective view of an embodiment of a PV-integrated 2×2 interferometric modulator array 140. As discussed above in relation to FIG. 7F, an interferometric modulator array 140 may include inactive areas, such as gaps 74 between columns of the mechanical layer 34 and rail supports 73. Inactive areas may also include etch holes 76 or pillars 75 formed within the active pixel 101. In the embodiment of FIG. 14, a patterned back PV black mask 115 is formed behind the array 140. The inactive areas in the array 140 or image region may comprise transparent inactive structures capable of allowing ambient light 107a to reach the patterned back PV black mask 115. As shown, the patterned back PV black mask 115 is patterned to correspond to a pattern of inactive structures through which light can pass. For example, the PV black mask 115 may be patterned to form strips 147, 148 underneath the gap 74 and/or the rail 73. The PV black mask 115 may be patterned to form a cross-like pattern beneath or behind the array 140. For a large array, the pattern may be patterned to have the shape of a grid corresponding to the spaces between active pixel regions 101. The back PV black mask 115 may be formed on a backplate 145, as shown. Additionally, the back PV black mask 115 can include an "island" or unconnected portions of PV material (PV black mask island 146). As will be understood by the description of FIGS. 15A and 15B below, front PV black mask 110 formed in front of an interferometric modulator array can also have a grid pattern as illustrated in FIG. 14.

Advantageously, the cross-like pattern formed behind the array 140 may extend to the periphery of the display 140 to allow for electrical connection of the front and back electrodes of the back PV black mask 115 with external circuitry. For embodiments of PV black mask 110, 115 that include islands like the PV black mask island 146, electrical connection with external circuitry may be made via a blanket TCO layer in electrical contact with the PV material 81 of the PV black mask island 146 (see FIGS. 17A, 17B and attendant description). In other embodiments, electrical connection with external circuitry may be made using vias, patterned metal traces, or patterned TCO films. In embodiments with patterned metal traces, the metal traces will be kept small so as not to reduce the amount of light incident upon the PV material 81 in the PV black mask island 146, or the traces can be routed by way of vias to the back side of the backplate 145.

The examples of light passing around or between pixels 101, through gaps 74 and through support structures 18 or 73 (as in light ray 107a) demonstrate taking advantage of light passing through inactive areas within the image region or pixel array. Materials can be chosen to maximize transmission through such inactive areas. Exemplary transparent materials may comprise dielectrics such as silicon dioxide ($SiO_2$), titanium dioxide ($TiO_2$), magnesium fluoride ($MgF_2$), chromium (III) oxide ($Cr_3O_2$), silicon nitride ($Si_3N_4$), etc. However, any transparent or partially transparent material may be used for the structures in the inactive areas.

As illustrated in FIG. 14, the PV active material 81 may be sandwiched between two layers of conductive material 143, 144 that can serve as electrodes. The front electrode 144 can include or be made of a transparent conductor, such as ITO or other TCO. It will be understood that the PV active material 81 may be configured to be in electrical contact with only one layer of a transparent conducting material and that the back electrode(s) 143 of a back PV black mask 115 can be opaque.

The transparent conductive layer may comprise any transparent, conducting material. Many transparent conducting materials are transparent conducting oxides (TCO). TCO layers are often used with photovoltaic materials, particularly thin film photovoltaic materials, in order to improve electrode contact to the PV material without blocking light. Functionally the TCO may electrically form a part of PV cell electrodes, which typically comprise opaque metallic or conducting electrodes in electrical contact with the TCO material. In display applications, the opaque electrodes may be patterned to form windows where the PV material can capture significant light. Alternatively, electrodes may make contact with the transparent conducting material outside of the image display region altogether and only TCO used for the electrodes within the array or image region. As known to those with skill in the art, a common TCO is indium tin oxide (ITO). Methods of forming or depositing ITO are well known in the art and include electron beam evaporation, physical vapor deposition, or sputter deposition techniques. Other TCO materials and processes of manufacture may also be used. While the illustrated back PV black mask 115 need only have transparent conductor for its front electrodes 144, it will be understood that for a front PV mask 110 (see FIG. 12) it may be useful to employ transparent conductors for electrodes on both sides of the PV material 81.

Figure 15A:
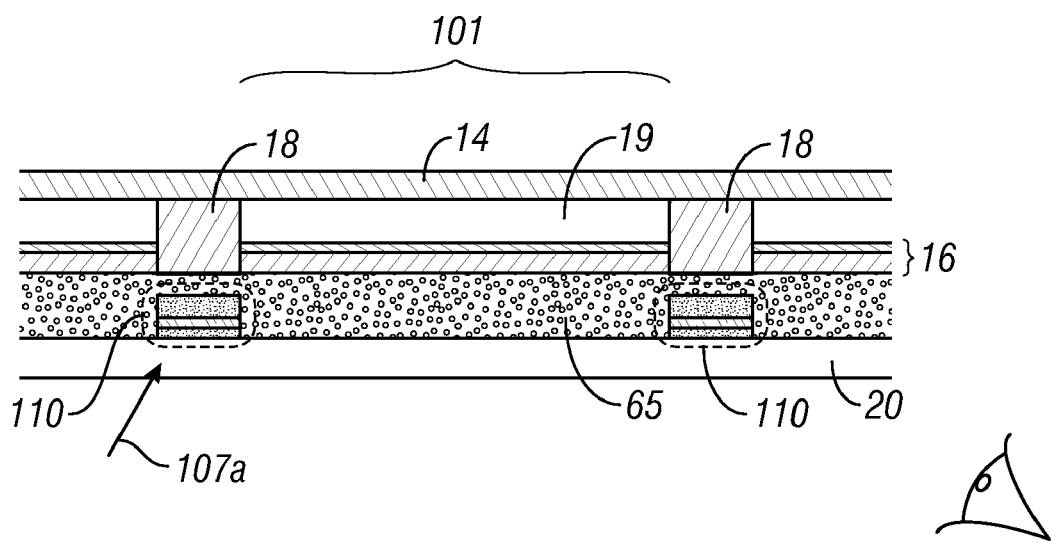
FIG. 15A is a schematic cross section of an embodiment of an interferometric modulator with an integrated, front side PV black mask.
Figure 15B:
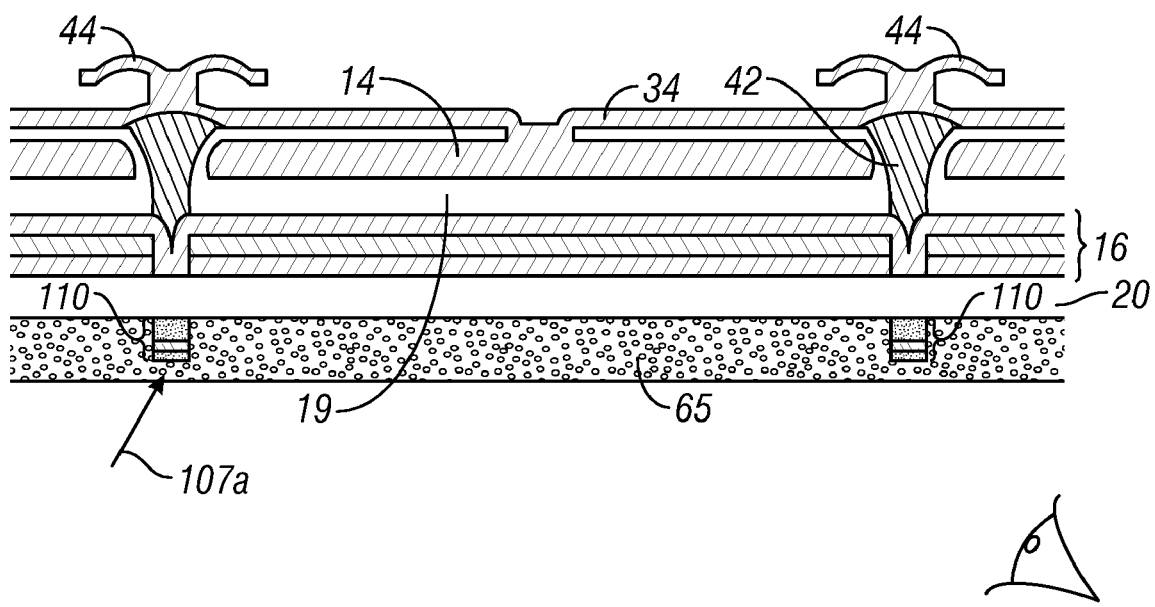
FIG. 15B is a schematic cross section of another embodiment of an interferometric modulator with an integrated back side PV black mask.

FIGS. 15A and 15B illustrate two embodiments of MEMS devices that are generally similar to the embodiments illustrated in FIGS. 7A-7E. However, the embodiments of FIGS. 15A and 15B comprise a front PV black mask 110 in front of (on the image or viewer side of) the active pixel 101. As illustrated by the position of the viewer, FIGS. 15A and 15B are inverted with respect to FIGS. 10-14.

In FIG. 15A, a buffer layer 65 of transparent material is formed over the front PV black mask 110 to provide a planarized surface for the formation of the interferometric modulator. The buffer layer may also provide insulation for lines to electrically connect isolated front PV black mask 110 regions such as isolated stips 147, 148 or isolated islands 146. If such lines traverse active pixels, they could be made transparent or may be made small to minimize reflections. The support 18 is aligned with and is about the same size as the cross-sectional area of the front PV black mask 110. In other embodiments, the cross-sectional area of the PV black mask 110 is not necessarily equal to the area of the support 18, but corresponds in both size and pattern to the cross-sectional area and pattern of the support 18 so as to sufficiently mask this inactive area and absorb incident ambient light 107a from reflecting off of any surfaces in the interferometric modulator. The front PV black mask 110 can exceed the support in surface area by, e.g., <10% or <5%.

As illustrated in FIG. 15A, the front PV black mask 110 is embedded in a buffer layer 65 over the substrate 20. The light modulating element or IMOD (comprising an optical stack 16, a movable layer 14, and a cavity 19 separating the optical stack 16 from the movable layer 14) is over the buffer layer 65. As a portion of the buffer layer 65 is over the front PV black mask 110, the front PV black mask 110 is also electrically insulated from the support 18 and does not provide electrical path or connection to the light modulating element.

Alternatively, as shown in FIG. 15B, the front PV black mask 110 may be formed on a side of the substrate 20 opposite the interferometric modulator. In this embodiment, the PV black mask may be embedded in a similar buffer layer 65 or otherwise encapsulated, but on the opposite side of the substrate 20. To manufacture the embodiment of FIG. 15B, a display may first be formed on one side of the substrate 20. The PV black mask 110 may then be formed on the other side of the substrate as discussed further, below. Alternatively, the PV black mask 110 may be formed first on one side, and the display may then be formed on the opposite side.

The various embodiments disclosed herein may be manufactured in different ways. For example, a display comprising an array of active pixels in an image region may be integrated with a PV black mask 110, 115 by lamination of one of a patterned PV black mask and the display onto the other. Alternatively, for a PV black mask disposed behind a display, the PV black mask may be formed and patterned on a backplate that may be metallic or transparent, depending upon the application. The backplate may then be aligned and attached to the display to form the rear surface of the display device. In other embodiments where the PV black mask is disposed in front of the display, the PV black mask may be formed on a transparent coverplate, such as glass or plastic. The coverplate may then be attached or laminated onto the display, or the display may then be formed or deposited on one or the other side of the coverplate. While it is not necessary that the pattern formed by the PV black mask 110, 115 be identical to the pattern formed by inactive areas, the patterned PV black mask preferably covers and is aligned with the pattern of the inactive areas such that the PV black mask can absorb can mask most of the unwanted light available in the inactive areas.

Figure 16:
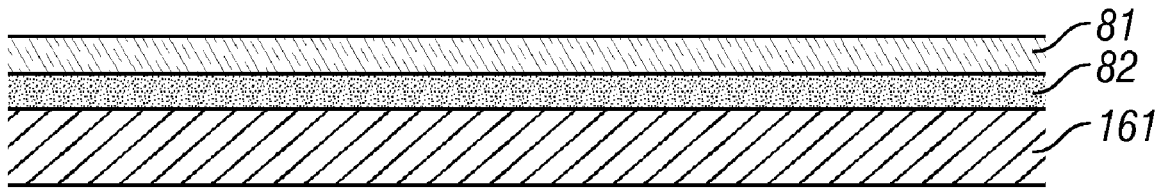
FIG. 16 is a schematic cross section illustrating initial steps in an embodiment of a method for making a PV black mask.
Figure 17A:
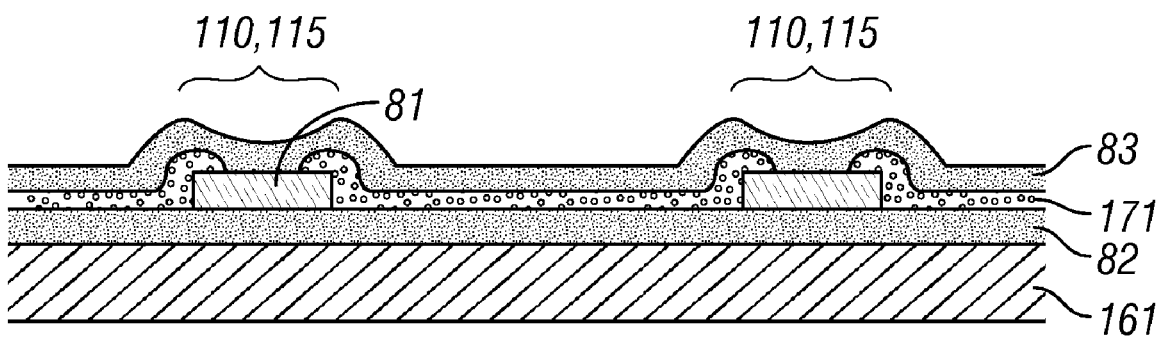
FIGS. 17A and 17B are schematic cross sections illustrating embodiments for patterning a photovoltaic material to form a PV black mask and methods of interconnecting isolated features of the patterned PV black mask.
Figure 17B:
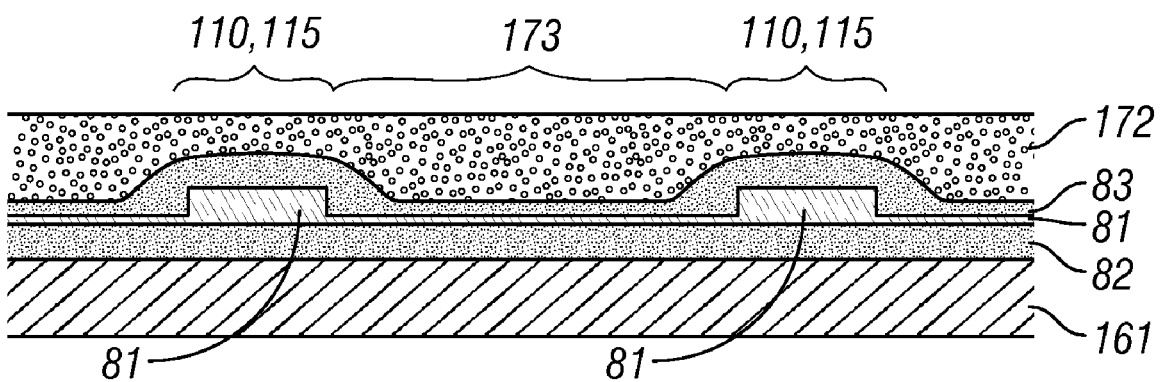

FIGS. 16, 17A and 17B depict steps in an embodiment of manufacturing a PV black mask like the front and back PV black masks 110, 115 described above. As shown in FIG. 16, the process may begin with the blanket deposition of a thin film PV material layer 81 over an electrode layer 82 onto a suitable substrate 161. The substrate 161 may correspond to one or the other side of substrate 20 in FIGS. 15A and 15B. In embodiments where the PV black mask 115 is formed behind the active pixels, the substrate 161 may include the display itself such that the PV black mask 115 is formed over the back side of the display. Alternatively, like the embodiment of FIG. 14, substrate 161 may include a backplate to be later assembled with the display and disposed behind the display. In other embodiments, the substrate 161 may comprise a sacrificial substrate. The sacrificial substrate may then be laminated on the front or back side of a display device and removed to leave the patterned PV black mask. Preferably, the lamination is conducted so that the pattern of the PV black mask 110, 115 is aligned with the pattern of inactive areas in the pixel array.

As will be appreciated by the skilled artisan, continuous black mask patterns across the array, such as grid patterns between pixels, can readily be routed to a circuit for charge storage in a battery or directly powering electrical devices, such as the display itself or associated electronics (like a cell phone). Isolated PV material, such as islands to mask isolated posts, may entail special routing. FIGS. 17A and 17B illustrate one method for routing current generated by the PV material. Alternatively, for such islands, the skilled artisan will appreciate that the traces can be routed by way of vias to the back side of the backplate 145.

FIG. 17A shows a device after the patterning of the blanket PV material layer 81 of FIG. 16 and the further deposition of a dielectric buffer layer 171 and a second electrode 83. The dielectric buffer layer 171 may help to electrically isolate the two electrodes 82, 83 in regions between isolated islands of PV material 81. The electrodes 82, 83 may comprise transparent conducting layers, or may comprise opaque metallic electrodes or both. If electrodes 82, 83 comprise reflective or opaque metallic electrodes, care is preferably taken to pattern the metallic portion of electrodes 82, 83 so as to minimize reflections and maximize the window to the PV material 81. An optional planarization layer may be formed over the structure shown in FIG. 17A, such as the planarization layer 172 of FIG. 17B.

FIG. 17B, like FIG. 17A above, shows a device after the patterning of the blanket PV material layer 81 of FIG. 16. However, in the embodiment of FIG. 17B, the electrodes 82, 83 are prevented from electrical contact not by a buffer (as in FIG. 17B), but rather by thinned portions of PV material 81. Hence, while the FIG. 17A patterns the PV material 81 so as to remove all of the PV material 81 from some areas (e.g., active pixel areas), the embodiment of FIG. 17B patterns the PV material 81 so as to thin the PV material 81 significantly is some areas, while leaving the PV material 81 relatively thick in areas intended to serve as PV black mask 110, 115 areas.

Generally speaking, PV black masks 110, 115 may comprise thin film photovoltaic materials, as described above. Some advantages of thin film PV cells are small device footprint and scalability of the manufacturing process. In some embodiments, such as the embodiment of FIG. 17B, thin film PV cells may be designed to be partially transmissive. In such embodiments, the transmittance of the PV material 81 in active pixel areas 173, outside inactive areas in which the PV black mask 110, 115 is desired, is high enough for the display image to remain good.

In addition, parts of the interferometric modulator pixel may be configured or designed to be partially transmissive and the active pixels may therefore be designed to be capable of allowing considerable ambient light to pass through and reach the PV cell 115 and its PV active material 81. In general, the reflector 14 may, for example, comprise a metal layer, such as aluminum (Al), molybdenum (Mo), zirconium (Zr), tungsten (W), iron (Fe), gold (Au), silver (Ag), and chromium (Cr) or an alloy of the foregoing, such as MoCr. The reflector 14 is typically thick enough to be opaque (e.g., 300 nm or more). However, in other embodiments, the reflector 14 is a partial reflector for a "transflective" IMOD display. The transmissivity of the reflector 14 in certain embodiments is dependent on the thickness of the reflector 14. Generally, a metallic reflector 14 that is a partial reflector will be between 20 and 300 Å, preferably less than 225 Å. By using thin semireflective layers in the reflectors 14 in various embodiments of a PV-integrated display 100, the interferometric modulator may be configured to allow from about 5% to about 50% to pass through select portions of the active array of display pixels to reach the photovoltaic material. In such arrangements, the patterned PV black mask can underlie such transflective regions to capture light passing therethrough.

While the foregoing detailed description discloses several embodiments of the invention, it should be understood that this disclosure is illustrative only and is not limiting of the invention. It should be appreciated that the specific configurations and operations disclosed can differ from those described above, and that the methods described herein can be used in contexts other than fabrication of semiconductor devices. The skilled artisan will appreciate that certain features described with respect to one embodiment may also be applicable to other embodiments. For example, various features of an interferometric stack have been discussed with respect to the front side of a photovoltaic cell, device or array, and such features are readily applicable to an interferometric stack formed over a back side of a photovoltaic cell, device or array. For example, various reflector features have been discussed with respect to various embodiments of interferometric modulators formed over a front side of a PV device. Such reflector features are also applicable to interferometric modulators formed over a back side of a PV device, including the use of partial reflectors, or the omission of a reflector while using the back electrodes as a reflector for some embodiments of an interferometric modulator.

We claim:

1. A display device displaying an image toward a front side, with a back side opposite the front side, the display device comprising:
   a reflective interferometric modulator display comprising an array region having a front side and a back side, the array region including active pixel areas and inactive areas, wherein the active pixel areas comprise reflective electromechanical systems devices;
   a photovoltaic cell including a photovoltaic material, wherein the photovoltaic material is formed over one of the front side and the back side of the array region, and wherein the photovoltaic material is patterned to correspond to a pattern of at least some of the inactive areas, the pattern including inactive areas separating adjacent active pixel areas; and
   a power supply, wherein the photovoltaic cell is configured to provide power to the power supply.

2. The device of claim 1, wherein the photovoltaic material comprises a deposited thin film photovoltaic material.

3. The device of claim 1, wherein the photovoltaic material further serves as a black mask to reduce reflections in the inactive areas of the array region.

4. The device of claim 3, wherein the photovoltaic material is configured to reflect or transmit less than 10% of visible light incident upon the photovoltaic material.

5. The device of claim 4, wherein the photovoltaic material is capable of receiving light from both the front and back sides of the photovoltaic material.

6. The device of claim 1, wherein the photovoltaic material is formed over the back side of the array region.

7. The device of claim 6, wherein a front side electrode is separated from a back side electrode by one of a dielectric buffer layer and a thinned portion of the photovoltaic material.

8. The device of claim 7, wherein the active pixel areas comprise microelectromechanical systems (MEMS) devices.

9. The device of claim 8, wherein the MEMS devices comprise interferometric modulators.

10. The device of claim 7, wherein the inactive areas comprise transparent inactive structures capable of allowing ambient light to reach the photovoltaic material and wherein the photovoltaic material is patterned to correspond to a pattern of the inactive structures.

11. The device of claim 10, wherein the transparent inactive structures comprise spaces between pixel areas.

12. The device of claim 1, wherein the photovoltaic material is formed over the front side of the array region.

13. The device of claim 12, wherein the photovoltaic material is patterned to mask the inactive areas of the array region.

14. The device of claim 13, wherein the active pixel areas comprise microelectromechanical systems (MEMS) devices.

15. The device of claim 14, wherein the MEMS device comprises an interferometric modulator.

16. The device of claim 13, further comprising a transparent conducting film in electrical contact with the photovoltaic material.

17. The device of claim 16, wherein the photovoltaic material is capable of receiving light incident upon the photovoltaic material through the transparent conducting film from the front and the back of the photovoltaic cell.

18. The device of claim 16, wherein the display comprises a backlight.

19. The device of claim 1, wherein the photovoltaic material is patterned to include islands of photovoltaic material.

20. The device of claim 19, wherein the photovoltaic material is patterned to correspond to inactive areas including one of etch holes or pillars.

21. A display device displaying an image toward a front side, with a back side opposite the front side, the display device comprising:
   a display comprising an array region having a front side and a back side, the array region comprising active pixel areas and inactive areas, wherein the active pixel areas comprise reflective electromechanical systems devices;
   a photovoltaic cell comprising a photovoltaic material, wherein the photovoltaic material is formed over one of the front side and the back side of the array region, and wherein the photovoltaic material is patterned; and
   a transparent conducting film in electrical contact with the photovoltaic material;
   wherein the photovoltaic material further serves as a black mask to reduce reflections in the inactive areas of the array region;
   wherein the photovoltaic material is configured to reflect or transmit less than 10% of visible light incident upon the photovoltaic material; and
   wherein the photovoltaic material is capable of receiving light from both the front and back sides of the photovoltaic material.

22. The device of claim 21, wherein the photovoltaic material is patterned to expose the active pixel areas and align with at least some of the inactive areas.

23. The device of claim 22, wherein the inactive areas include areas separating adjacent active pixel areas.

24. The device of claim 21, wherein the photovoltaic material comprises a deposited thin film photovoltaic material.

25. A method of manufacturing a display device, the display device configured to display an image toward a front side, with a back side opposite the front side, the method comprising:
   providing a reflective interferometric modulator display including an array region, the array region including active pixel areas and inactive areas, wherein the active pixel areas comprise reflective microelectromechanical systems (MEMS) devices;
   disposing a photovoltaic material over one of the front side and the back side of the array region, patterning the photovoltaic material to correspond to a pattern of at least some of the inactive areas, the pattern including inactive areas separating adjacent active pixel areas; and
   a power supply, wherein the photovoltaic material is configured to provide power to the power supply.

26. The method of claim 25, further including aligning the patterned photovoltaic material with the pattern of the inactive areas.

27. A display device displaying an image toward a front side, with a back side opposite the front side, the display device comprising:
   a reflective interferometric modulator display including an array region, the array region including active pixel areas and inactive areas, wherein the active pixel areas comprise reflective electromechanical systems devices;
   a photovoltaic cell including a photovoltaic material, wherein the photovoltaic material is formed over the back side of the array region, and wherein the photovoltaic material is patterned to correspond to a pattern of at least some of the inactive areas, the pattern including inactive areas separating adjacent active pixel areas; and a power supply, wherein the photovoltaic cell is configured to provide power to the power supply.

28. The display device of claim 27, wherein the pattern further includes isolated inactive areas formed within the active pixel areas.

* * * * *

UNITED STATES PATENT AND TRADEMARK OFFICE
CERTIFICATE OF CORRECTION

| | |
|---|---|
| PATENT NO. | : 8,169,686 B2 |
| APPLICATION NO. | : 12/254782 |
| DATED | : May 1, 2012 |
| INVENTOR(S) | : Manish Kothari and Kasra Khazeni |

It is certified that error appears in the above-identified patent and that said Letters Patent is hereby corrected as shown below:

In Column 13, Line 12, change "(a-silicon)," to --(α-silicon),--.

In Column 14, Line 3, change "electrochemical" to --electro-chemical--.

In Column 22, Line 49, in Claim 25, change "region," to --region;--.

Signed and Sealed this
Twenty-eighth Day of August, 2012

David J. Kappos
*Director of the United States Patent and Trademark Office*